(12) United States Patent
Hidaka et al.

(10) Patent No.: US 6,845,477 B2
(45) Date of Patent: Jan. 18, 2005

(54) SEMICONDUCTOR TEST DEVICE FOR CONDUCTING AN OPERATION TEST IN PARALLEL ON MANY CHIPS IN A WAFER TEST AND SEMICONDUCTOR TEST METHOD

(75) Inventors: Hideto Hidaka, Hyogo (JP); Tsukasa Ooishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 671 days.

(21) Appl. No.: 09/799,581

(22) Filed: Mar. 7, 2001

(65) Prior Publication Data

US 2001/0047496 A1 Nov. 29, 2001

(30) Foreign Application Priority Data

May 29, 2000 (JP) ........................................ 2000-158019

(51) Int. Cl.[7] .......................... G01R 31/28; G01R 31/26
(52) U.S. Cl. ........................ 714/729; 714/724; 324/765
(58) Field of Search ................................ 714/724, 729, 714/710, 711, 718, 719, 730, 733; 324/765, 754; 365/200

(56) References Cited

U.S. PATENT DOCUMENTS 5,416,740 A * 5/1995 Fujita et al. ................. 365/200
6,400,173 B1 * 6/2002 Shimizu et al. ............. 324/765

FOREIGN PATENT DOCUMENTS

| JP | 9-89991 | 4/1997 |
| JP | 2726993 | 12/1997 |
| JP | 10-90358 | 4/1998 |

OTHER PUBLICATIONS

"Practical Application of Wafer Burn–In Allowing Collective Contact with Al Electrode", Nikkei Microdevices, Jan. 2000, pp. 148–153.
"Development and Mass–Production of the Wafer–Level CSP as a Product is started", Nikkei Microdevices, Feb. 1999, pp. 4–5 and 40–67.

* cited by examiner

*Primary Examiner*—Albert Decady
*Assistant Examiner*—James C. Kerveros
(74) *Attorney, Agent, or Firm*—McDermott Will & Emery LLP

(57) ABSTRACT

A plurality of test target chips on a test target wafer are simultaneously and electrically coupled to a plurality of chips on a test wafer via a wafer contactor. Each chip on the test wafer has a test circuit for conducting an operation test on each chip on the test target wafer. Since the test circuit is in a one-to-one relationship with respect to the test target chip, and is arranged on the test wafer other than the test target wafer, the many chips can be simultaneously tested in parallel during the wafer test without increasing an area of the test target chips.

12 Claims, 19 Drawing Sheets

SEMICONDUCTOR TEST DEVICE FOR CONDUCTING AN OPERATION TEST IN PARALLEL ON MANY CHIPS IN A WAFER TEST AND SEMICONDUCTOR TEST METHOD

BACKGROUND OF THE INVENTION

1. Field of the Invention

The present invention relates to a semiconductor test device, and particularly a semiconductor test device for evaluating an operation of a semiconductor device in a state of wafer (which will also be referred to as a "wafer level" hereinafter) as well as a semiconductor test method using the semiconductor test device.

2. Description of the Background Art

In accordance with development of a wafer level CSP (Chip Size Package) technology for processing package steps in the state of wafer, a semiconductor test device which conducts an operation test on a semiconductor device on the wafer level, which will be merely referred to as a "wafer test" hereinafter) has been of increasing importance. In a conventional semiconductor test device for the wafer test, the number of chips which can be simultaneously subjected to a parallel test, i.e., a simultaneously testable number is restricted primarily due to the following two problems.

(1) Due to a structure of a probe of a probe card for bringing a chip to be tested into electrical contact with a semiconductor test device, It is difficult to perform simultaneous contact with many chips.

(2) Since there are restrictions on numbers of power supplies on the semiconductor test device side, clock drivers and signals, it is difficult, e.g., to generate signals for simultaneously testing many chips. Further, due to the structure of the probe card, it is difficult to arrange many signal lines. This also restricts the simultaneously testable number.

For the problem (1) described above, a wafer contactor which allows the simultaneous parallel test of many chips on the wafer is now being developed. The wafer test using such a wafer contactor is specifically described in NIKKEI MICRODEVICES, February 1999, pp. 40–67.

FIG. 23 conceptually shows the wafer test using the wafer contactor.

Referring to FIG. 23, a wafer 10 (which will be merely referred to as a "test target wafer" hereinafter) having chips to be tested has a plurality of electrode pads 12 for input/output of electrical signals to and from the chips. A bump 14 is arranged on a top surface of each electrode pad 12. Bump 14 is formed of, e.g., a solder ball, and is provided for ensuring good contact between the electrode pad 12 and a board or the like to be electrically coupled thereto. Bump 14 is integrally formed on electrode pad 12.

FIG. 24 conceptually shows contact between a wafer contactor and the test target wafer.

Referring to FIG. 24, a wafer contactor 20 includes a plurality of contact terminals 22 for electrical contact with wafer 10 to be tested. When each contact terminal 22 is in contact with bump 14, it allows transmission of electrical signals to and from corresponding electrode pad 12 on wafer 10. As an example of the structure of the wafer contactor, a wafer contactor of a type using a spring probe is disclosed in NIKKEI MICRODEVICES, February 1999, page 52.

Referring to FIG. 23 again, contact terminals 22 can also be in electrical contact with board terminals 52 on a test board 50, respectively.

By employing the wafer contactor of the above structure, it is possible to make simultaneously electrical contact with the whole electrode pads required for all the chips on wafer 10 to be tested. Thereby, the problem (1) described above can be overcome.

However, it is impossible to overcome the foregoing problem (2) only by the technology of the wafer test using the wafer contactor described above, and it is difficult to improve the simultaneously testable number. According to the wafer level CSP technology, the devices are in the state of wafer when operation tests are performed, and the devices are shipped without operation test in the state of after packing. Therefore, it is important to increase the simultaneously testable number in the wafer test.

As measures for overcoming both the foregoing problems (1) and (2), such a method may be employed that each chip on the wafer to be tested is internally provided with a BIST (Built In Self Test) function, and these chips are simultaneously activated to test simultaneously the many chips on the wafer. By using the BIST function, the operation test can be conducted on each chip without using a dedicated test device such as an external memory tester, and therefore the simultaneously testable number can be improved. However, each chip must include a circuit having the BIST function, resulting in increase in chip area and cost.

According to the wafer level CSP technology, the operation test must be conducted in the wafer test for obtaining information, which is used for performing replacement repair of a defective memory cell by using a spare line provided in advance on the memory cell. This replacement repair will be referred to as "redundant repair" hereinafter. A test circuit for performing this redundant repair requires a larger area than an ordinary test circuit, which determines only PASS/FAIL of the test target chip. Therefore, the BIST system containing such test circuits further increases the required chip area.

The test circuit for the redundant repair is not used after the repairing of defective portions is performed based on the result of the operation test. Therefore, internal arrangement of the test circuits results in a waste of structure. A structure provided with a plurality of memory cores in each chip suffers from further remarkable increase in chip area because the test circuit for redundant repair is internally arranged for each memory core.

A kind of semiconductor device, which is called a system LSI, can be divided into various types, which are included in a group requiring the test circuit having the BIST function or a group not requiring it. In some types, the test circuit is not required after the redundant repair. Accordingly, it is desired to provide a method and/or structure which can flexibly determine whether the test circuit is to be internally arranged or not.

SUMMARY OF THE INVENTION

An object of the invention is to provide a semiconductor test device and a semiconductor test method, which can suppress increase in area of a chip to be tested, and can increase the number of chips allowing a simultaneous parallel test in a wafer test.

Another object of the invention is to provide a semiconductor device, which can efficiently store data related to redundant repair adaptable to memory mats of various structures.

Still another object of the invention is to provide a semiconductor device, which can easily determine whether a specific function is to be provided or not.

In summary, the inverter provides a semiconductor test device for conducting an operation test on a test target wafer having a plurality of first chips, including a first wafer contactor and a plurality of test circuits. The first wafer contactor can be simultaneously and electrically coupled to each of the plurality of first chips. The plurality of test circuits are provided corresponding to the plurality of first chips, respectively, and each conduct the operation test on the corresponding first chip. Each test circuit transmits at least a portion of a signal group for performing the operation test through the first wafer contactor to and from the corresponding first chip.

A major advantage of the invention is that the operation test is conducted simultaneously in parallel on the plurality of chips on the test target wafer through the first wafer contactor so that many chips on the common wafer can be simultaneously tested in parallel while suppressing increase in layout area of the chips to be tested.

According to another aspect of the invention, a semiconductor test method of conducting an operation test on a wafer level includes the steps of electrically coupling first and second wafers together through a wafer contactor; producing a plurality of test signals for conducting the operation test on a plurality of first chips formed on the first wafer by a plurality of second chips formed on the second wafer corresponding to the plurality of first chips, respectively; transmitting the plurality of test signals from the second wafer to the first wafer via the wafer contactor; and transmitting a plurality of test data issued from the plurality of first chips to the second wafer from the first wafer through the wafer contactor in response to the plurality of test signals.

Accordingly, the operation test can be conducted on each chip on the first wafer by transmitting the signal produced by each chip on the second wafer via the wafer contactor. Therefore, increase in layout area of the chip to be tested can be suppressed, and further the electrical coupling between the wafers allows the simultaneous and parallel test of the many chips on the same wafer.

According to still another aspect of the invention, a semiconductor device includes a plurality of memory mats and an internal test circuit.

The plurality of memory mats operate in accordance with a plurality of independent address signals, respectively. Each memory mat includes a regular memory array having a plurality of memory cells arranged in rows and columns. The internal test circuit conducts an operation test on the plurality of memory mats. The internal test circuit includes a test pattern generating portion for generating a test signal to be supplied to the plurality of memory mats for conducting the operation test, a redundant repair determining portion for detecting a defective memory cell in the regular memory array in each memory mat based on test data issued from each memory mat in response to the test signal, and a defective address storing portion for storing a defective address indicative of the defective memory cell.

Each memory mat further includes a spare memory array for repairing the defective memory cell, and a spare decoder for selecting the spare memory array when the received address signal matches with the defective address in the corresponding memory mat stored in the defective address storing portion.

Accordingly, the defective address obtained in the operation test is stored in the internal test circuit, and redundant repair determination is executed in an actual operation by referring to the defective address stored in the internal test circuit. As a result, the redundant repair data (typically, the defective address) can be stored as uniform redundant repair data in the self-test circuit, independently of specifications such as bit numbers and word structures of the respective memory mats in the semiconductor device. Therefore, it is possible to simplify the test circuits related to the redundant repair for the semiconductor devices, which employ various memory mat structures and may be classified into various types.

According to yet another aspect of the invention, a semiconductor memory device includes first and second chips.

The first chip has a first function, and the plurality of first chips are formed on a first wafer. The second chip has a second function different from the first function, and the plurality of second chips are formed on a second wafer. The second chip is prepared by cut-out from the second wafer, and is electrically connected to the first chip when being packaged.

Accordingly, the second chip, which has the function different from that of the first chip and is prepared by cut-out from the different wafer, is arranged on the first chip for electrical connection so that the new function can be added. Therefore, provision and non-provision of the new function can be flexibly determined in the assembly step.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now described in greater detail with reference to the drawings.

First Embodiment

Figure 1:
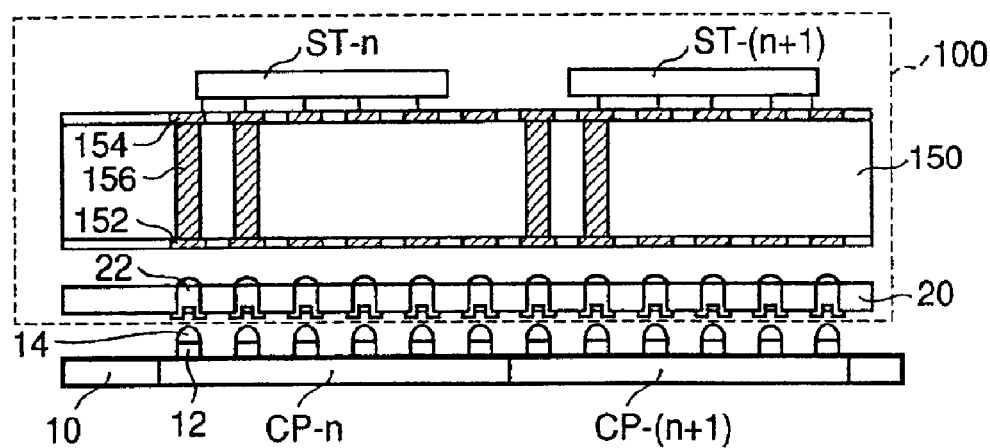
FIG. 1 shows a structure of a semiconductor test device 100 according to a first embodiment of the invention.

Referring to FIG. 1, a test target wafer 10 to be tested has a plurality of chips CP. FIG. 1 shows chips CP-n and CP-(n+1) in the nth (n: natural number) and (n+1)th positions among these plurality of chips CP. An electrode pad 12 allowing input/output of an electrical signal is arranged on each chip, and a bump 14 is also provided for achieving a good electrical contact between electrode pad 12 and an external system.

Figure 23:
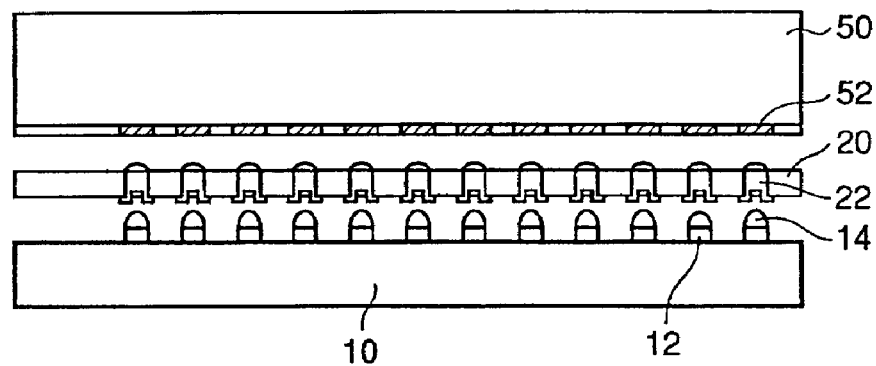
FIG. 23 shows a wafer test using a wafer contactor.
Figure 24:
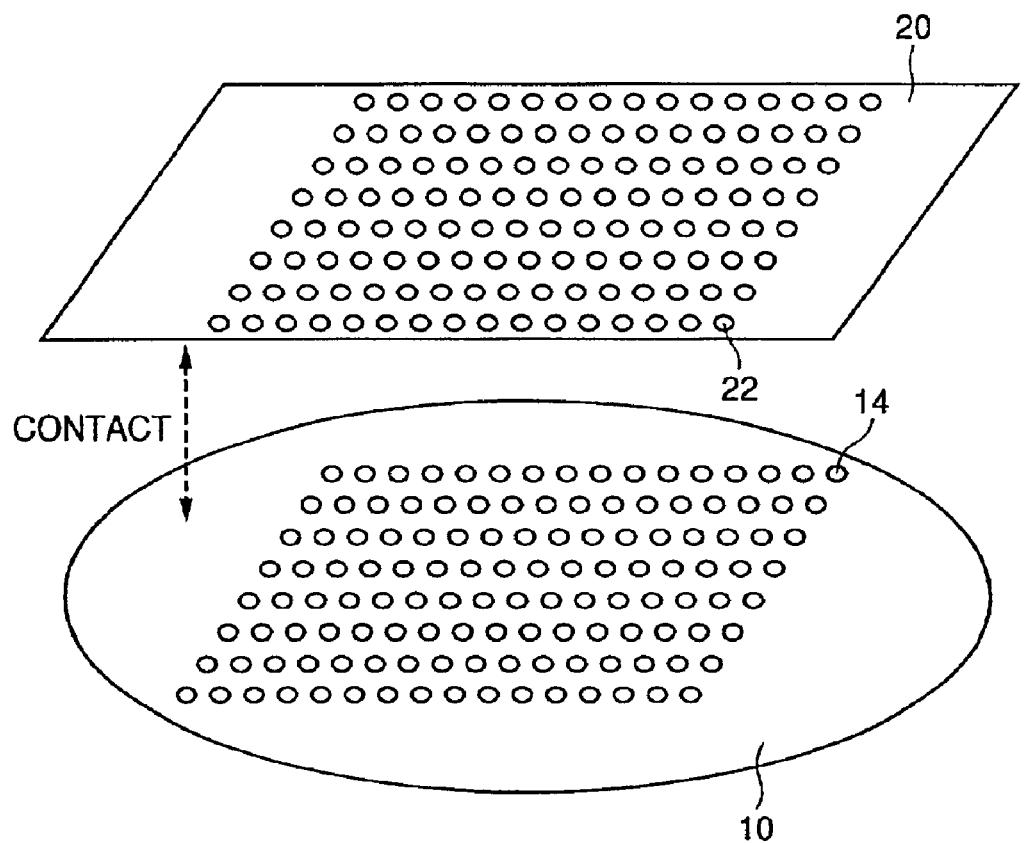
FIG. 24 shows contact between the wafer contactor and a test target wafer.

Semiconductor test device 100 according to the first embodiment includes a wafer contactor 20 and a test board 150. Wafer contactor 20 includes a plurality of contact terminals 22 provided corresponding to the plurality of bumps 14, respectively. Each contact terminal 22 can be in electrical contact with bump 14, and thereby can be electrically coupled to corresponding electrode pad 12 on chip CP simultaneously. Test target wafer 10 including bumps 14 and wafer contactor 20 are similar to those shown in FIGS. 23 and 24, and therefore description thereof is not repeated.

Test board 150 includes board terminals 152 provided corresponding to contact terminals 22, respectively. Self-test circuits ST which can perform a self-test corresponding to the BIST function are mounted on test board 150. FIG. 1 shows self-test circuits ST-n and ST-(n+1) provided corresponding to chips CP-n and CP-(n+1), respectively. The self-test circuit is provided for each chip to be tested, and conducts the operation test on the corresponding chip.

Figure 2:
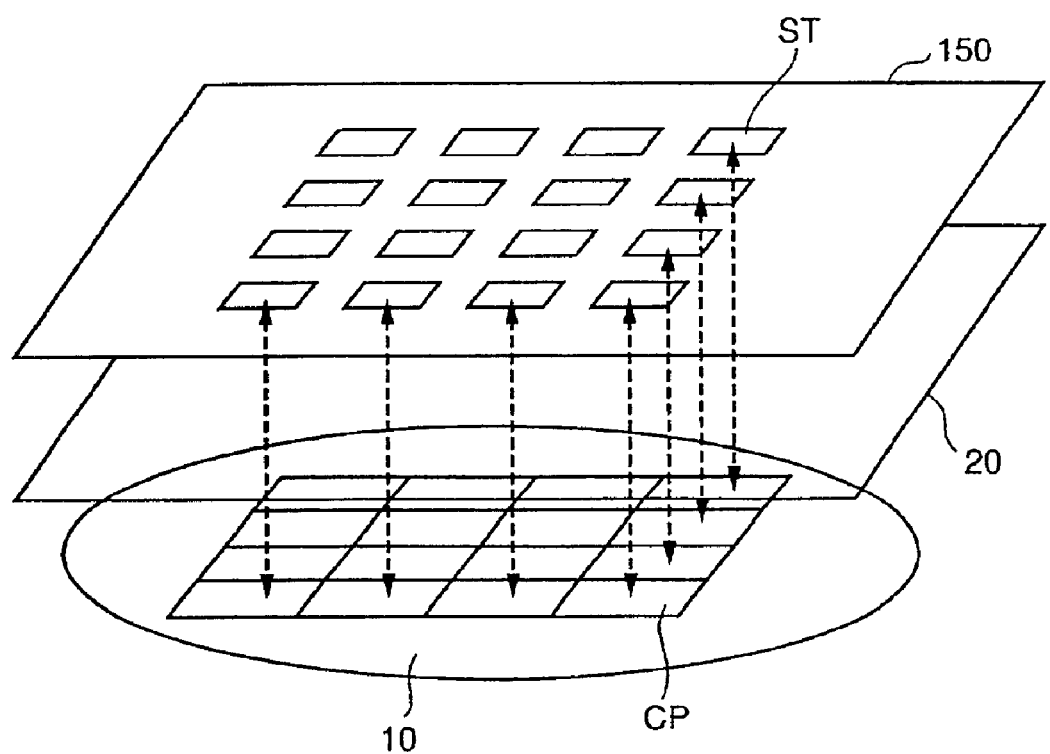
FIG. 2 conceptually shows a wafer test according to the first embodiment of the invention.

Referring to FIG. 2, self-test circuits ST which are arranged on test board 150 correspond to respective chips CP on test target wafer 10. Each self-test circuit ST and corresponding chip CP are electrically coupled together via wafer contactor 20 in a one-to-one relationship, and electrical signals for performing the operation test can be transmitted between them.

Figure 3:
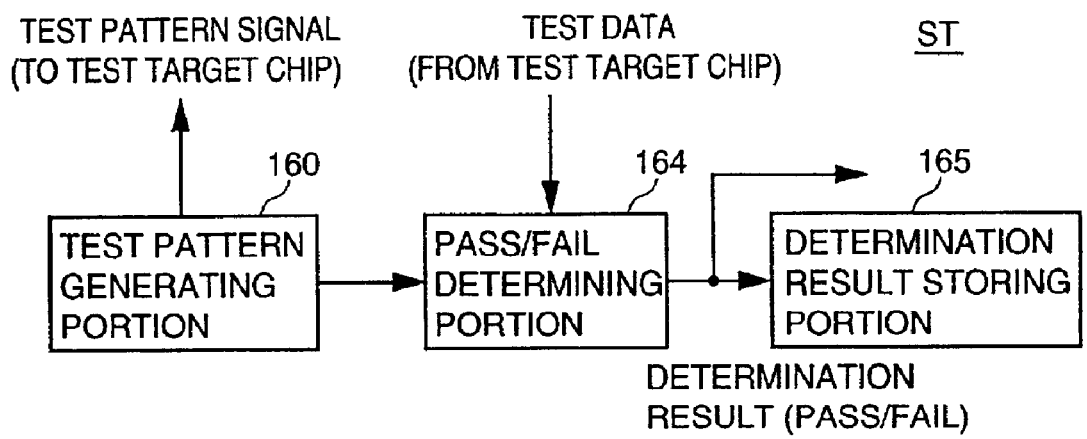
FIG. 3 is a block diagram showing a structure of a self-test circuit ST.

Referring to FIG. 3, self-test circuit ST includes a test pattern generating portion 160 for generating a test pattern signal to the test target chip, a PASS/FAIL determining portion 164 which receives test data issued from the test target chip in response to the test pattern signal, and a determination result storing portion 165 for storing a result of the determination by PASS/FAIL determining portion 164.

Test pattern generating portion 160 produces a test pattern signal which is used for conducting the predetermined operation test. PASS/FAIL determining portion 164 issues the result of determination indicating the result (i.e., PASS or FAIL) of the operation test based on the test data. Determination result storing portion 165 is provided for storing the determination result thus issued, but may be eliminated if a structure for directly reading out the determination result to an external system is employed.

Referring to FIG. 1 again, test board 150 further includes board terminals 154 for connecting self-test circuits ST to test board 150. Test board 150 is a double-sided substrate, and carries board terminals 152 and 154 on its first and second surfaces, respectively. Test board 150 further has interconnection paths 156 which are arranged between the board terminals, and correspond to the electrode pads requiring contact in the operation test.

According to the above structure, self-test circuit ST and chip CP to be tested are electrically coupled together in a one-to-one relationship through board terminals 152 and 154 as well as contact terminal 22 so that input/output of the signal required for the operation test can be performed. As described above, self-test circuit ST which can conduct the operation test via the wafer contactor can be provided for each chip CP on the test target wafer in a one-to-one relationship. As a result, the operation test corresponding to the BIST function can be performed for each chip CP on the test target wafer by a simple structure, and therefore the simultaneously testable number in the wafer test can be improved. Further, increase in chip area can be avoided because self-test circuit ST is not finally left on the test target chip.

Second Embodiment

As a second embodiment of the invention, description will now be given on a structure for performing a wafer test, in which a test wafer which carries a circuit having a test function is used corresponding to test target wafer 10, and is connected thereto via a wafer contactor for performing the wafer test.

Figure 4:
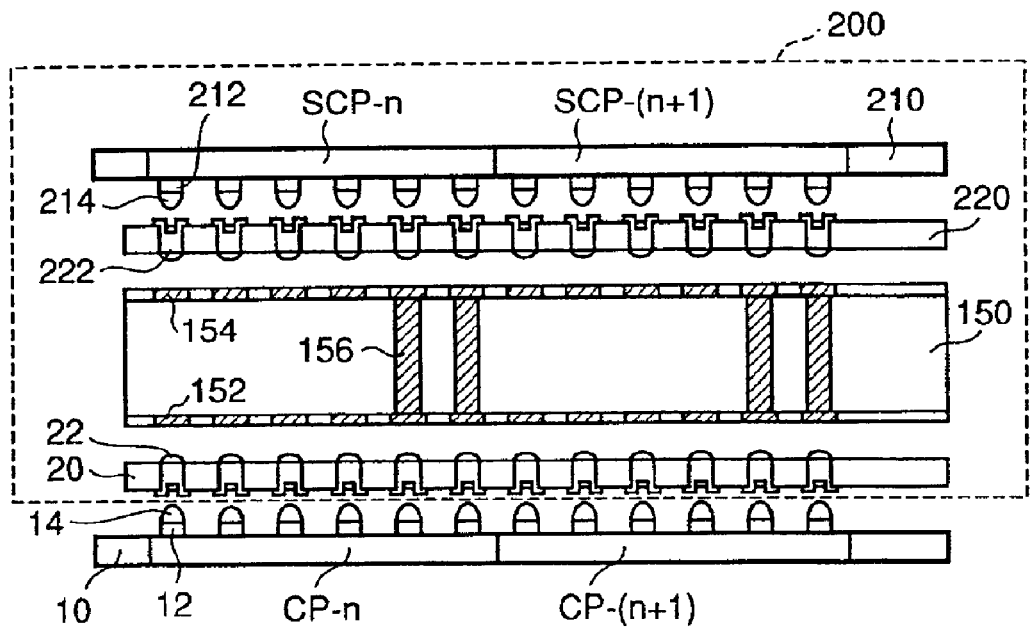
FIG. 4 shows a structure of a semiconductor test device 200 according to a second embodiment of the invention.

Referring to FIG. 4, semiconductor test device 200 according to the second embodiment differs from semiconductor test device 100 shown in FIG. 1 in that a test wafer 210 and a wafer contactor 220 are further employed. Test wafer 210 has a plurality of chips SCP corresponding to the plurality of chips CP on test target wafer 10, respectively. In semiconductor test device 200, the circuit for performing the self-test corresponding to the BIST function is not arranged on the test board 150, but is arranged on test wafer 210. On test wafer 210, electrode pads 212 and 214 are arranged similarly to test target wafer 10.

Wafer contactor 220 is provided for ensuring electrical contact between test wafer 210 and test board 150. Similarly to the first embodiment, test board 150 is provided at its first and second surfaces with board terminals 152 and 154.

Wafer contactor 220 is arranged on the second surface of test board 150 for making electrical contact between bumps 214 on test wafer 210 and board terminals 154. Wafer contactor 20 is arranged on the first surface of test board 150 for making electrical contact between board terminals 152 and bumps 14 on test target wafer 10. Test board 150 formed of the double-sided substrate is provided with interconnection paths 156 for electrical coupling between the board terminals on the first and second surfaces, as already described with reference to FIG. 1.

Figure 5:
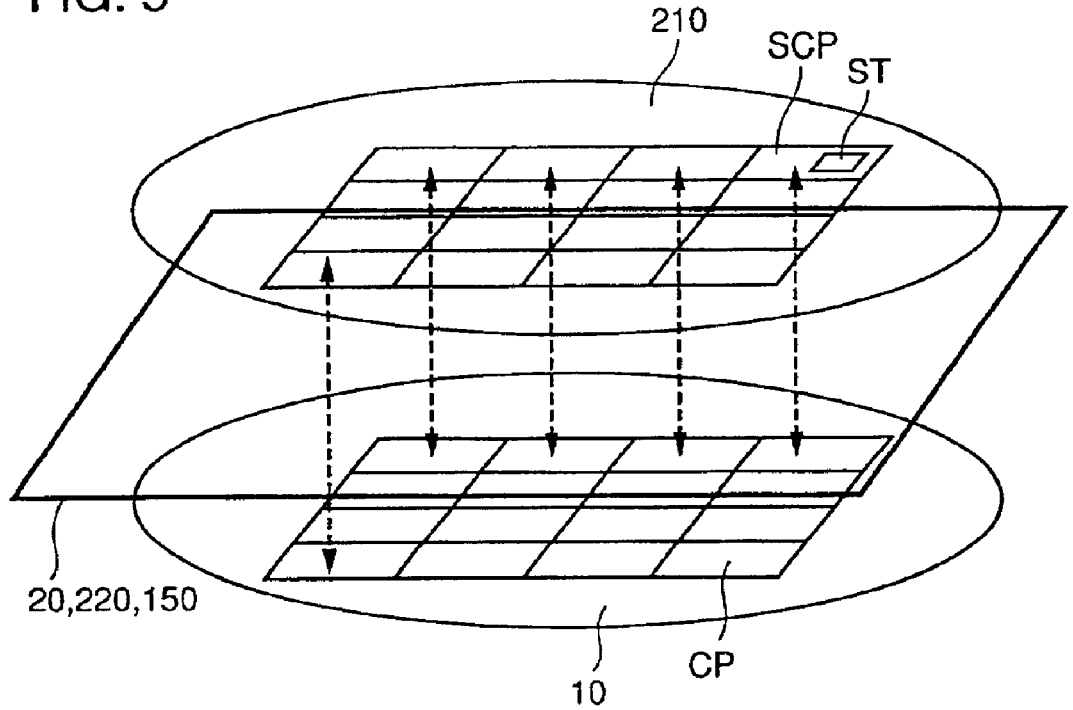
FIG. 5 conceptually shows a wafer test according to the second embodiment of the invention.

Referring to FIG. 5, test wafer 210 is provided with self-test circuits ST, which are arranged on chips SCP provided corresponding to chips CP on test target wafer 10, respectively. Each self-test circuit ST and corresponding chip CP are electrically coupled together via wafer contactors 20 and 220, and a test board 150. Thereby, the simultaneously testable number on the wafer level can be improved by the simple structure, similarly to the first embodiment. Since the self-test circuit ST is not finally left on the test target chip, increase in chip area can be improved. The second embodiment has such a distinctive advantage that the operation test can be performed by electrically connecting the wafers together.

Figure 6:
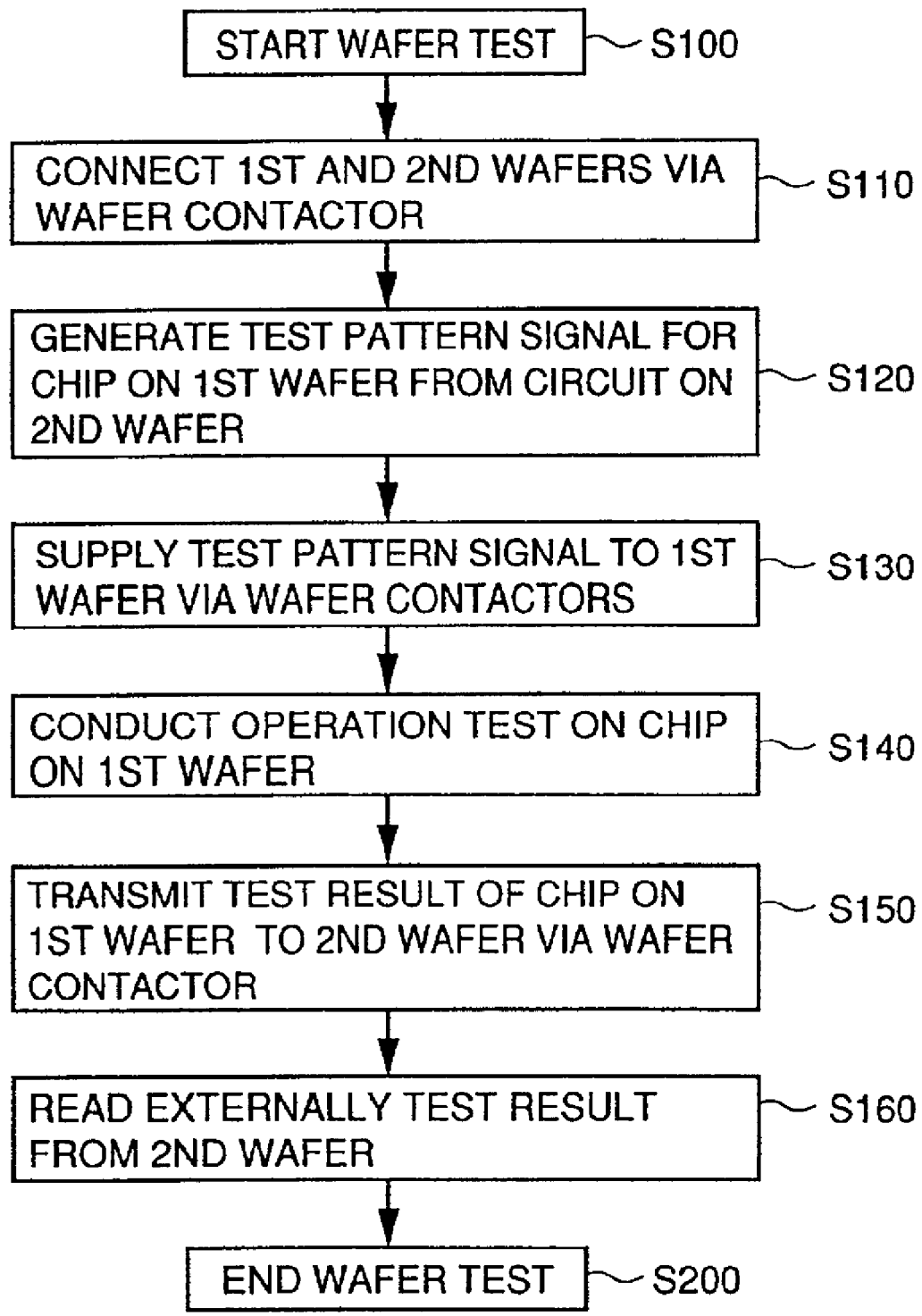
FIG. 6 is a flowchart showing an example of a semiconductor test method according to the second embodiment of the invention.

Referring to FIG. 6, when a wafer test starts (step S100), a first wafer which is test target wafer 10 and a second wafer which is test wafer 210 provided with, e.g., the self-test circuit are electrically coupled together via wafer contactors 20 and 220 (step S110). A test pattern generating portion in self-test circuit ST on the second wafer generates a test pattern signal for conducting the operation test (step S120). The test pattern signal is sent to electrode pad 12 of corresponding chip CP on the first wafer via wafer contactors 20 and 220 as well as test board 150 (step S130). In response to the supplied test pattern signal, the operation test is conducted on chip CP, and the test result is issued (step S140). The result of the operation test of the first wafer is transmitted to the second wafer via electrode pad 12, wafer contactors 20 and 220, and others (step S150). Thereafter, the result of the operation test, which is transmitted to the second wafer, is read out to an external tester system (S160) so that the wafer test is completed (step S200).

Figure 7:
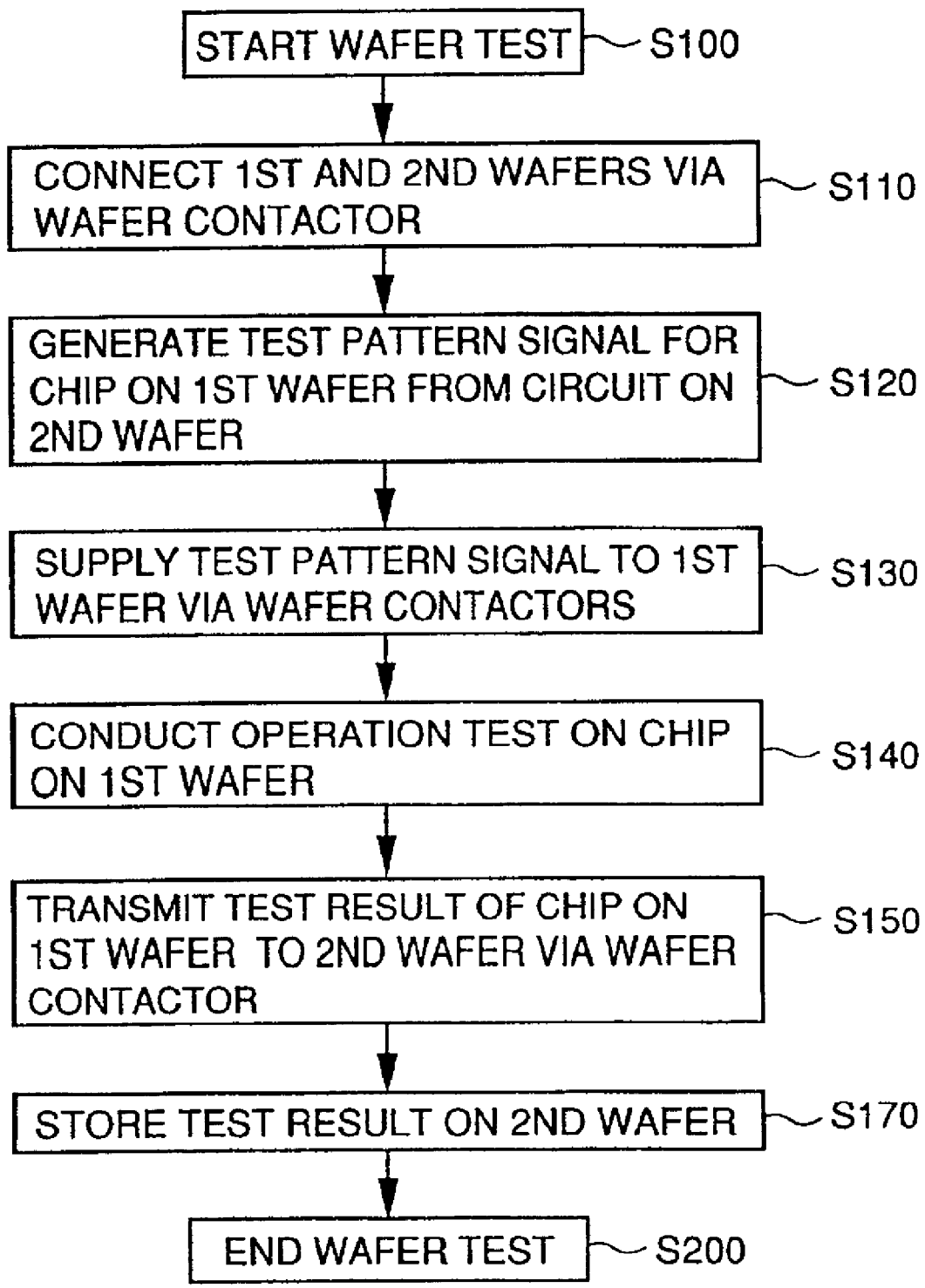
FIG. 7 is a flowchart showing another example of the semiconductor test method according to the second embodiment of the invention.

In the example of the semiconductor test method shown in FIG. 7, the result of operation test of the first wafer is transmitted to the second wafer by procedures similar to those in the flowchart shown in FIG. 6 (steps S100–S150).

Thereafter, the result of operation test transmitted to the second wafer is not read out to the external test system, but is stored in determination result storing portion 165 on the second wafer (step S170), whereby the wafer test ends (step S200).

Modification of the Second Embodiment

Figure 8:
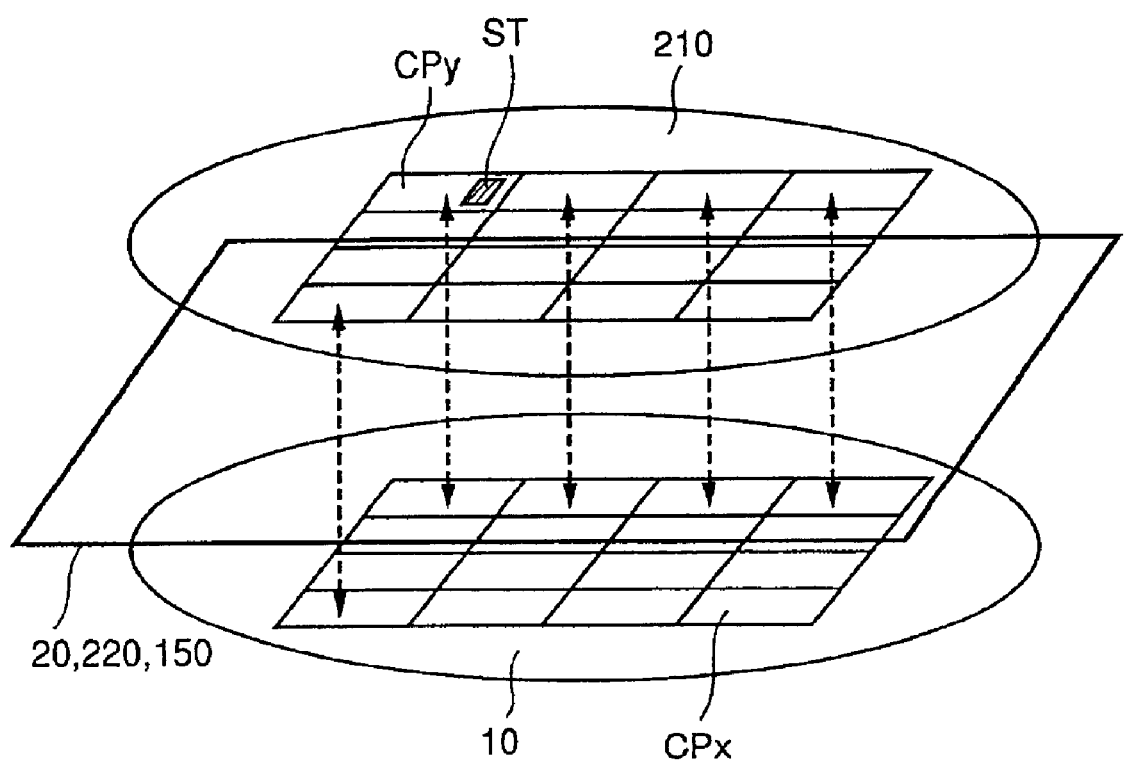
FIG. 8 conceptually shows a wafer test according to a modification of the second embodiment of the invention.

In the second embodiment described above, the two wafers are connected together via the wafer contactor and the test board. One of these wafers is the test target wafer, and the other carries the self-test circuit corresponding to the test target wafer. However, the wafer test which is performed by electrically connecting the wafers together can be applied to structures other than the above Referring to FIG. 8, each of first chips CPx formed on wafer 10 and each of second chips CPy formed on wafer 210 have different functions, and both are packaged within a single module to form a multi-chip module in a later step. The multi-chip module can be defined as a semiconductor device provided with multiple chips having different functions. For example, the first chip in the multi-chip module is an MPU (Microprocessor Unit), and the second chip corresponds to a memory device. In this case, both the first and second chips may be sent to the packaging step. Further, the first chip may be a test target, and the second chip may be a chip carrying a memory for testing the MPU which is the first chip.

Further, self-test circuit ST is mounted on one of the first and second chips, and the connection is made via the wafer contactor and the test board as already described in connection with the second embodiment, whereby the operation test can be conducted in the connected state on the wafer level after the multi-chip module is packaged. The function of self-test circuit ST may be divided and provided on the two chips. This can improve the flexibility in layout design of each chip.

The structure of the semiconductor test devices as well as the semiconductor test methods, which are already described as the first and second embodiments, can be applied not only to the case where the test target is the wafer but also to the general case where the test is performed on many chips already mounted on the board configured to conduct simultaneously the test on many chips.

Third Embodiment

As a third embodiment, description will be given on a structure, in which a portion of components of the self-test circuit is mounted on the chip to be tested.

Figure 9:
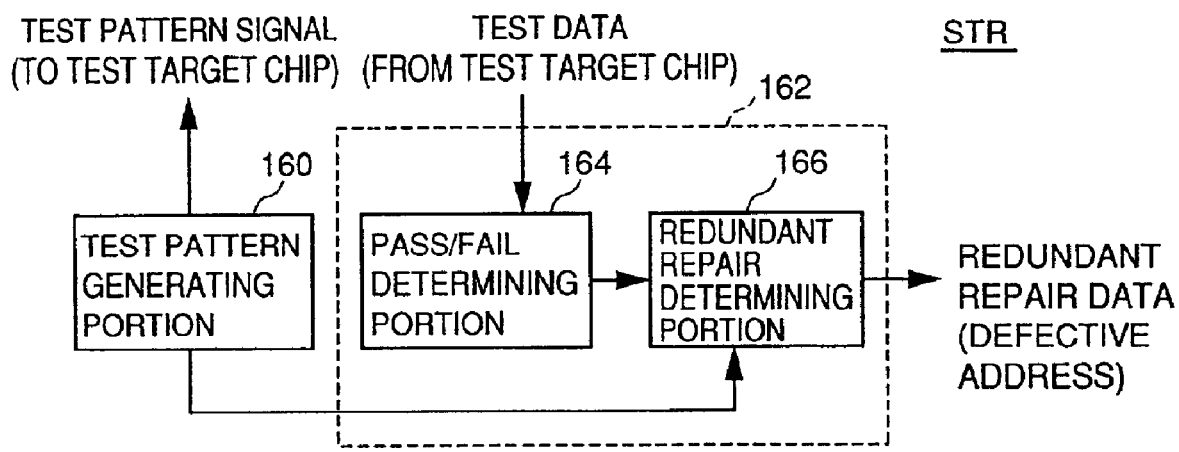
FIG. 9 is a block diagram showing a structure of a self-test circuit STR having a test function for redundant repair.

Referring to FIG. 9, self-test circuit STR further includes a redundant repair determining portion 166, which performs determination relating to redundant repair based on the test data, in addition to test pattern generating portion 160 for generating a test pattern signal and PASS/FAIL determining portion 164 receiving test data issued from the test target in response to the test pattern signal. Redundant repair determining portion 166 determines presence/absence of a defective portion, and analyses an address of the defective portion based on the test data. Redundant repair determining portion 166 issues redundant repair data including a defective address indicative of the defective portion. Although not shown, the structure may be additionally provided with a portion for storing redundant repair data.

The test target in which a defective portion is detected can be subjected to the redundant repair, which is performed by blowing off a fuse, e.g., with laser and thereby programming the defective address and others based on the redundant repair data obtained by the operation test.

Self-test circuit STR can be divided into test pattern generating portion 160 for generating the test pattern signal required for the operation test, and determining portion 162 for analyzing the test data obtained in response to the test pattern signal. Determining portion 162 include PASS/FAIL determining portion 164 and redundant repair determining portion 166.

In general, test pattern generating portion 160 has a relatively small area, and therefore does not increase the chip area to a large extent when mounted on the chip. However, determining portion 162 including redundant repair determining portion 166 has a considerably larger area than test pattern generating portion 160, and therefore remarkably increases the chip area when mounted on the chip.

Test pattern generating portion 160 can be used in the operation test after packaging. In contrast to this, determining portion 162 will not be used after the redundant repair, e.g., by fuse-cut is once performed. In particular, determining portion 162 is not required at all after the chip is packaged. Therefore, the circuits relating to redundant repair result in a large waste of structure if mounted on the chip.

Figure 10:
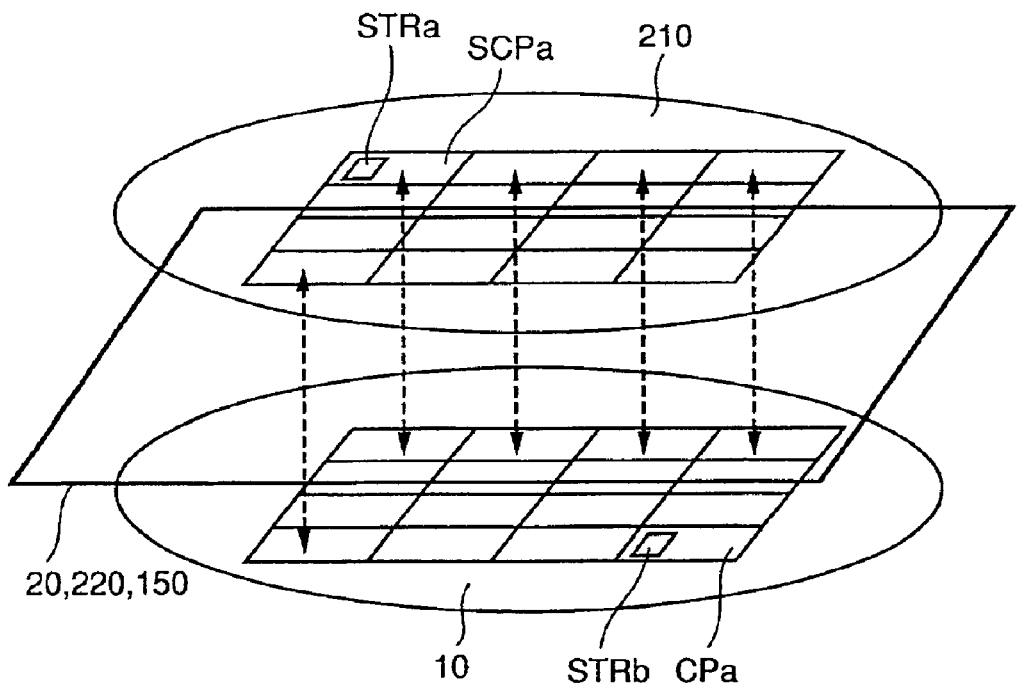
FIG. 10 conceptually shows a wafer test according to a third embodiment of the invention.

FIG. 10 conceptually shows the wafer test according to the third embodiment of the invention.

As can be seen from comparison between FIGS. 5 and 10, the structure for performing the wafer test according to the third embodiment differs from that shown in FIG. 5 in that each of chips CPa on test target wafer 10 and each of chips SCPa on test wafer 210 are employed instead of chips CP and SCP shown in FIG. 5. Self-test circuit STR shown in FIG. 9 can be divided into a self-test conducting portion STRb and a self-test determining portion STRa, which are disposed in the divided fashion at chip CPa on the test target wafer and chip SCPa on test wafer 210, respectively. The structures and arrangements of the electrode pad, wafer contactor and test board for providing electrical coupling between wafers 10 and 210 in the wafer test are the same as those already described in the second embodiment, and therefore description thereof is not repeated.

Figure 11:
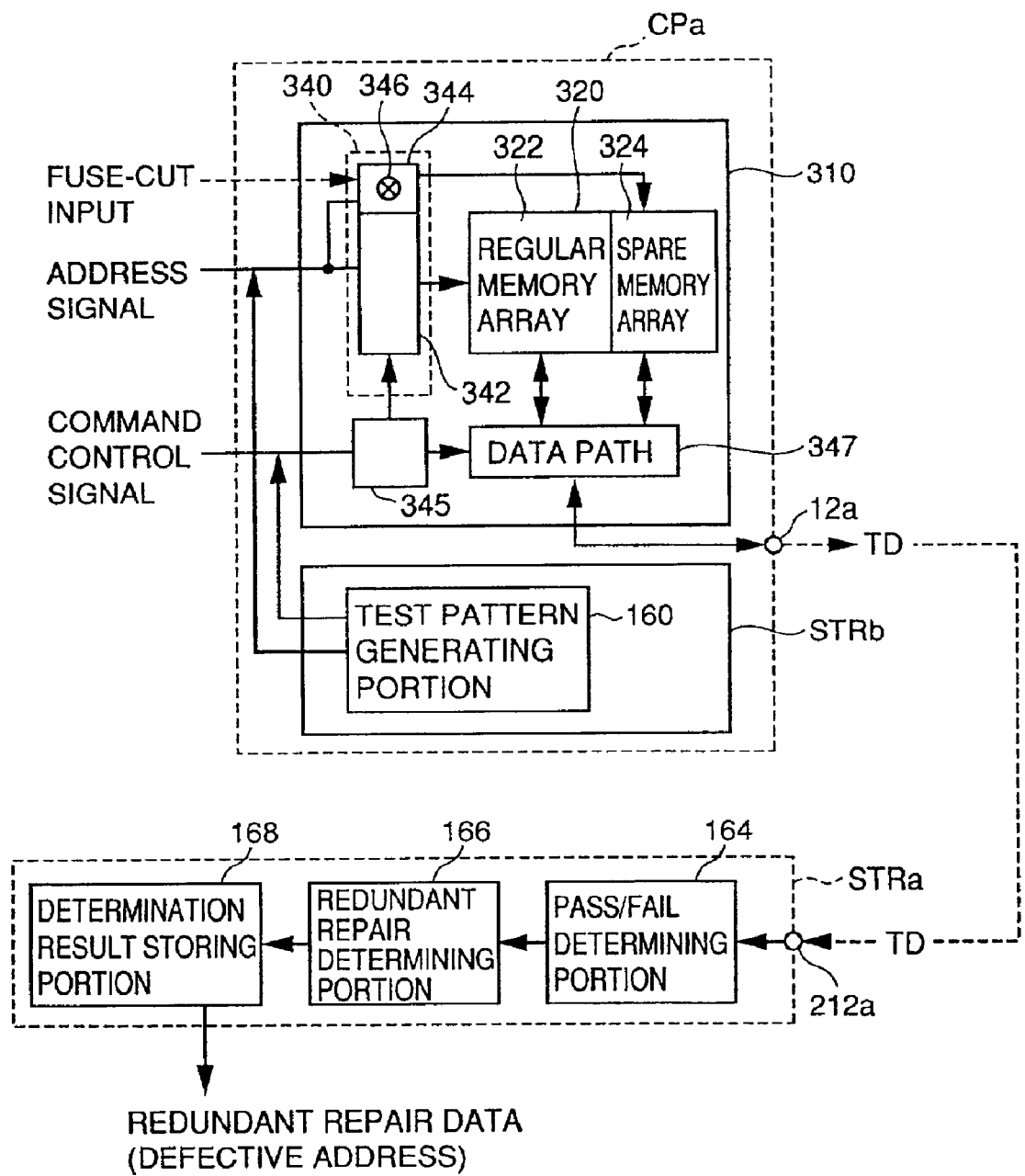
FIG. 11 is a block diagram showing an example of a structure of each chip in a semiconductor test device according to the third embodiment.

Referring to FIG. 11, chip CPa to be tested includes a memory core 310 and self-test conducting portion STRb.

Memory core 310 has a memory cell array 320, a decoder portion 340 for accessing the memory cell selected in accordance with an address, a control circuit 345 for conducting an operation according to a command control signal on memory cell array 320, and a data path 347 for conducting data input/output with respect to memory cell array 320 in accordance with an instruction sent from control circuit 345.

Memory cell array 320 has a regular memory array 322 and a spare memory array 324 for replacing and thereby repairing a defective memory cell in the regular memory array. Decoder portion 340 includes a regular decoder 342 for accessing an appropriate portion in regular memory array 322, and a spare decoder 344 for accessing an appropriate portion in spare memory array 324. Spare decoder 344 includes a program portion 346 for storing the defective address indicative of a defective memory cell which is detected by the operation test. Program portion 346 employs, e.g., a fuse element which can be blown off by laser input or high voltage input. Spare decoder 344 makes comparison between the defective address stored in program portion 346 and the input address. When the defective address is designated as the memory address to be accessed, and thus the input address matches with the defective address, access to spare memory array 324 is performed.

Self-test conducting portion STRb has test pattern generating portion 160 in self-test circuit STR. Test pattern generating portion 160 produces, as the test pattern signal, the address and the command control signal for operation test in the wafer test operation. Memory core 310 operates in accordance with the address and the command control signal generated by test pattern generating portion 160, and issues test data TD to electrode pad 12a.

Self-test determining portion STRa arranged in chip SCPa on test wafer 210 has PASS/FAIL determining portion 164, redundant repair determining portion 166 and determination result storing portion 168 corresponding to determining portion 162 in self-test circuit STR shown in FIG. 9. Self-test circuit STRa has an electrode pad 212a, which is connected via the wafer contactor and test board to electrode pad 12a of chip CPa sending the test data therefrom. Thereby, test data TD sent from test target chip CPa is transmitted via the wafer contactor to self-test determining portion STRa in the wafer test.

Self-test determining portion STRa executes the determination based on test data TD transmitted thereto, and stores the redundant repair data in determination result storing portion 168. The redundant repair data stored in determination result storing portion 168 is collectively read out from the plurality of self-test circuits carried on test wafer 210, and appropriate processing such as laser-cut is executed on program portion 346 for executing the redundant repair on memory core 310 in each test target chip CPa based on the redundant repair data thus read out.

According to the above structure, the test pattern generating portion of the self-test circuit, i.e., the structure portion which can be used in the operation test after packaging of the chip is arranged in the chip, and the structure portion which is not required after execution of the operation test relating to the redundant repair is arranged on the test wafer. Therefore, the operation test for the redundant repair can be efficiently performed. As a result, it is possible to improve the simultaneously testable number in the redundant repair test on the wafer level while suppressing increase in chip area.

Figure 12:
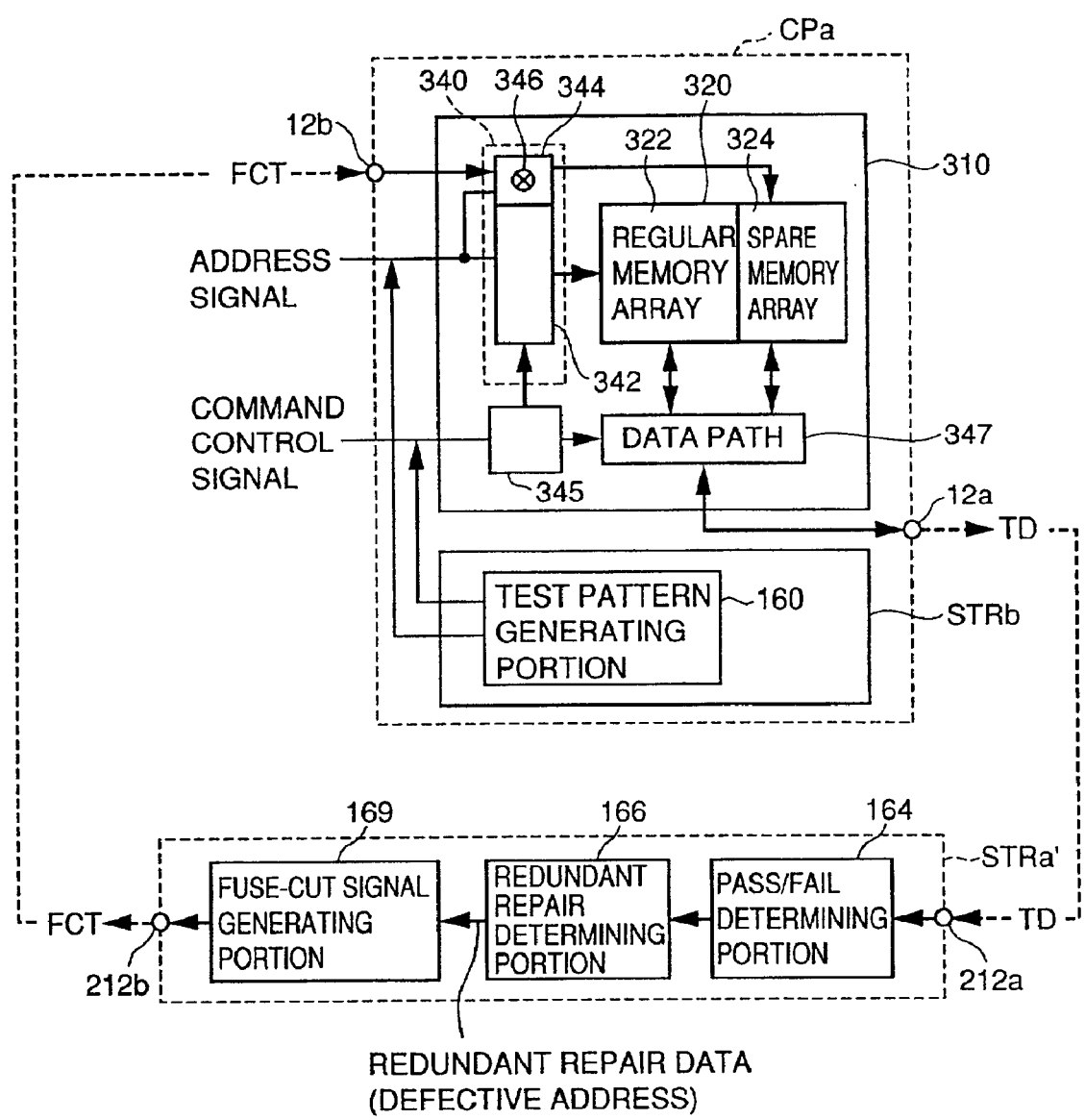
FIG. 12 is a block diagram showing another example of the structure of the self-test circuit in the semiconductor test device according to the third embodiment.

Referring to FIG. 12, a self-test determining portion STRa' differs from self-test circuit STRa shown in FIG. 11 in that determination result storing portion 168 is replaced with a program signal generating portion 169 which generates a control signal FCT for programming a defective address in program portion 346.

Program signal generating portion 169 issues, as control signal FCT, a high-voltage signal based on the redundant repair data to an electrode pad 212b. Chip CPa to be tested has an electrode pad 12b for receiving control signal FCT. Electrode pad 212b on the test wafer is electrically coupled to electrode pad 12b on the test target wafer via the wafer contactor and the test board.

According to the structure described above, a fuse element which can be blown off by application of a high voltage signal may be employed in program portion 346, whereby the programming processing for the defective address in chip CPa can be executed at the same time as the wafer test by applying a high voltage controlled by program signal generating portion 169 in the test wafer, without requiring addition of a later step for fuse-cut or the like.

Owing to arrangement of the test pattern generating portion in chip CPa, the operation test can be performed without using a memory tester even after packaging of the chip.

Fourth Embodiment

As a fourth embodiment, description will be given on a structure, which can efficiently conduct the wafer test in the case where a plurality of memory cores are arranged on the chip to be tested.

Figure 13:
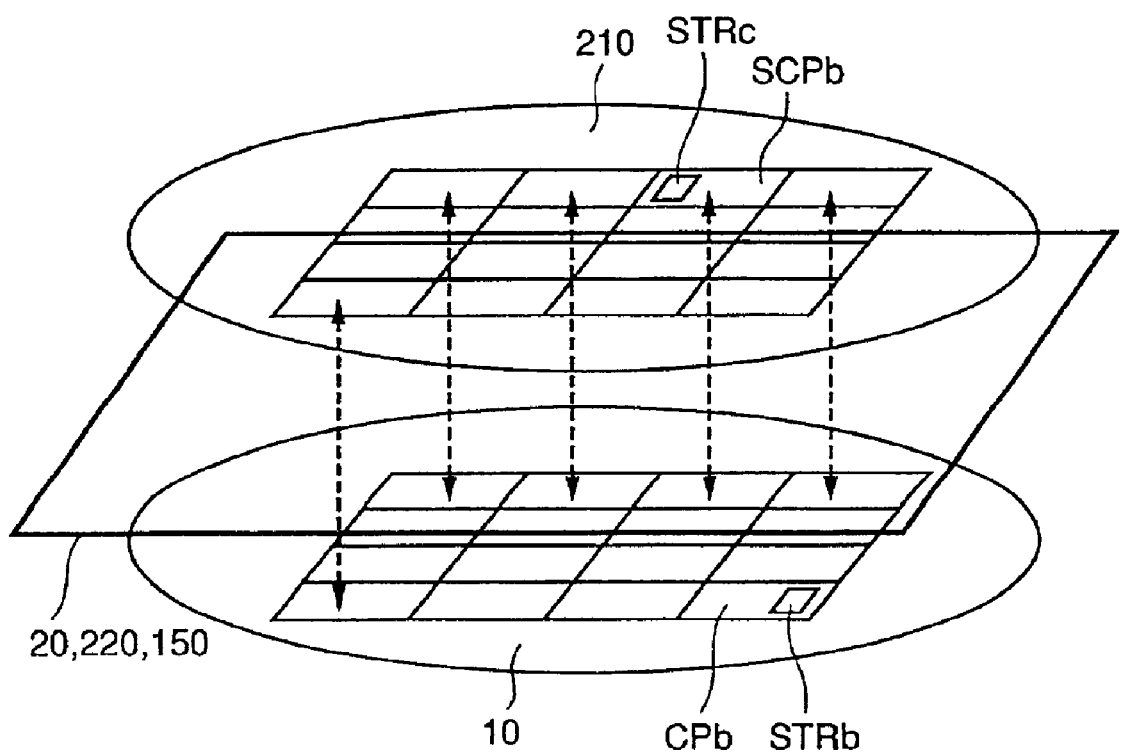
FIG. 13 conceptually shows a wafer test according to a fourth embodiment of the invention.

FIG. 13 conceptually shows a wafer test according to the fourth embodiment of the invention.

As can be seen from comparison between FIGS. 13 and 10, the structure for performing the wafer test according to the fourth embodiment differs from that in FIG. 10 in that each of chips CPb on test target wafer 10 and each of chips SCPb on test wafer 210 have structures different from those of chips CPa and SCPa in FIG. 10, respectively.

Self-test circuit STR is divided into self-test conducting portion STRb and a self-test determining portion STRc, which are disposed in a divided fashion at chip CPb on the test target wafer and chip SCPb on test wafer 210, respectively. The structures and arrangements of the electrode pad, wafer contactor and test board for providing electrical coupling between wafers 10 and 210 in the wafer test are the same as those already described in the second embodiment, and therefore specific description thereof is not repeated.

Figure 14:
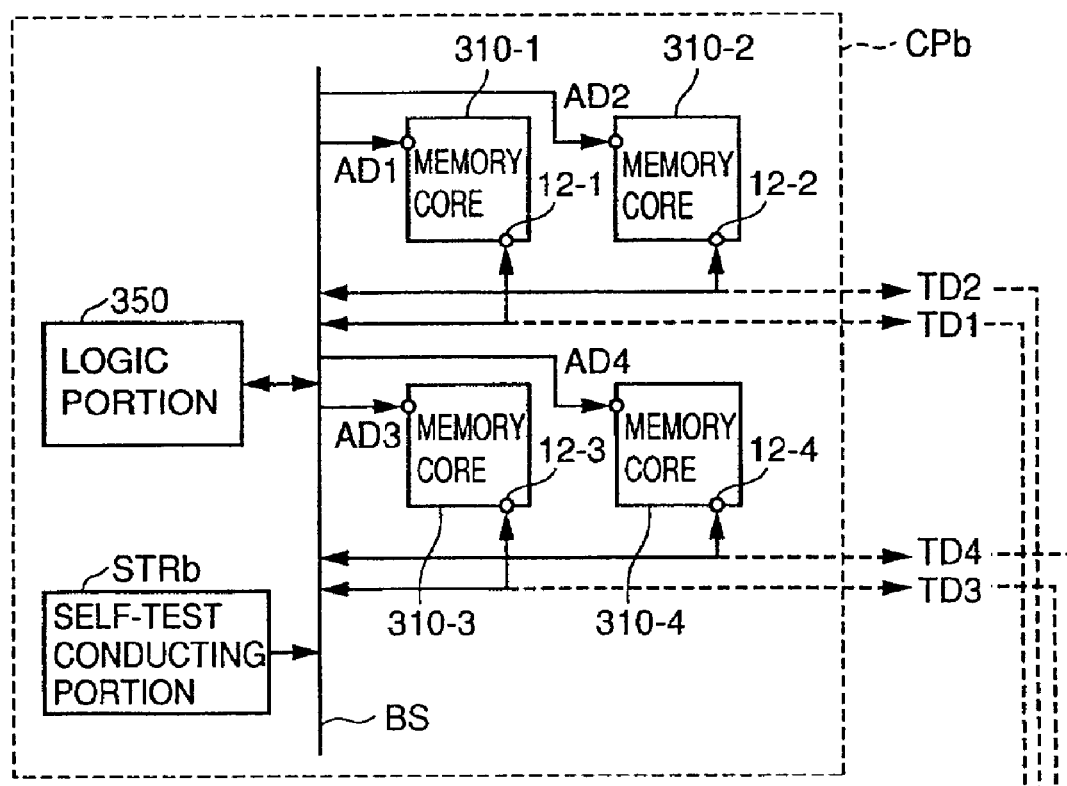
FIG. 14 is a block diagram showing an example of a structure of each chip in a semiconductor test device according to a fourth embodiment.
Figure 14:
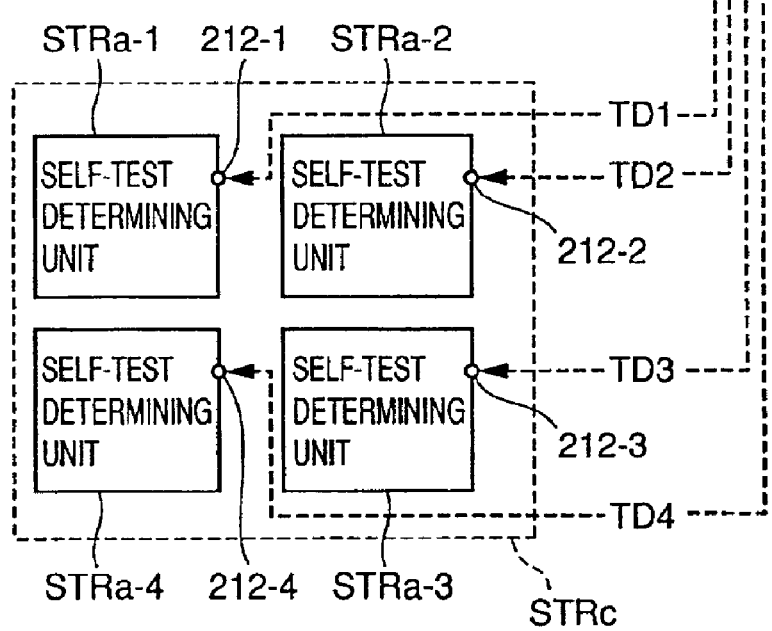

Referring to FIG. 14, chip CPb on the test target wafer has a plurality of memory cores 310-1, 310-2, 310-3 and 310-4. Although FIG. 14 shows the chip CPb provided the four memory cores, the plurality of memory cores in chip CPb may be more or less than four in number. Each memory core has the same structure as memory core 310 shown in FIG. 11.

Each memory core is accessed in accordance with an independent address signal. Thus, the memory access to memory cores 310-1, 310-2, 310-3 and 310-4 are performed in accordance with independent address signals AD1, AD2, AD3 and AD4, respectively.

Chip CPb further includes a logic portion 350 which produces the command control signal and address signal for each memory core, self-test conducting portion STRb, and a bus BS for transmitting data between logic portion 350, self-test conducting portion STRb and each memory core. Self-test conducting portion STRb is the same as that shown in FIG. 11, and therefore description thereof is not repeated.

In the wafer test, self-test conducting portion STRb issues the command control signal and address signal to each memory block via bus BS. Memory cores 310-1-310-4 perform the memory access based on corresponding address signals AD1–AD4, and issue test data TD1–TD4, respectively.

The test data issued from each memory core is sent to the electrode pad. For example, test data TD1 issued from memory core 310-1 is sent to electrode pad 12-1. Other memory cores likewise issue the test data to the corresponding electrode pads, respectively.

Self-test determining portion STRc has self-test determination units corresponding to the plurality of memory cores in chip CPb to be tested, respectively. Self-test determining units STRa-1, STRa-2, STRa-3 and STRa-4 are provided corresponding to memory cores 310-1, 310-2, 31-3 and 310-4 in chip CPb, and receive corresponding test data TD1, TD2, TD3 and TD4 for performing the redundant repair determination, respectively. Each self-test determining unit has the same structure as self-test determining portion STRa shown in FIG. 11. Each self-test determining unit performs the redundant repair determination based on the supplied test data, and produces the redundant repair data.

The redundant repair data which is obtained corresponding to the respective memory mats by self-test determining portion STRc can be collectively read out from the test wafer after the wafer test, and a new step for performing the programming such as fuse-cut may be additionally employed, as already described with reference to FIG. 11. Alternatively, the redundant repair data may be processed as already described with reference to FIG. 12, in which case self-test determining portion STRc produces a high-voltage signal for programming the defective address, and the programming such as fuse-cut is directly performed at the time of wafer test.

Although the chip described above is internally provided with the plurality of memory cores, the structure described above allows the efficient operation test for redundant repair determination of the chip on the wafer level with an improved simultaneously testable number, while suppressing increase in chip area.

Particularly, in the wafer test, the operation test can be performed using the electrode pads, which do not allow external contact after the packaging. Therefore, the operation test for redundant repair determination can be efficiently conducted in parallel on the plurality of memory cores arranged in the same chip.

Figure 15:
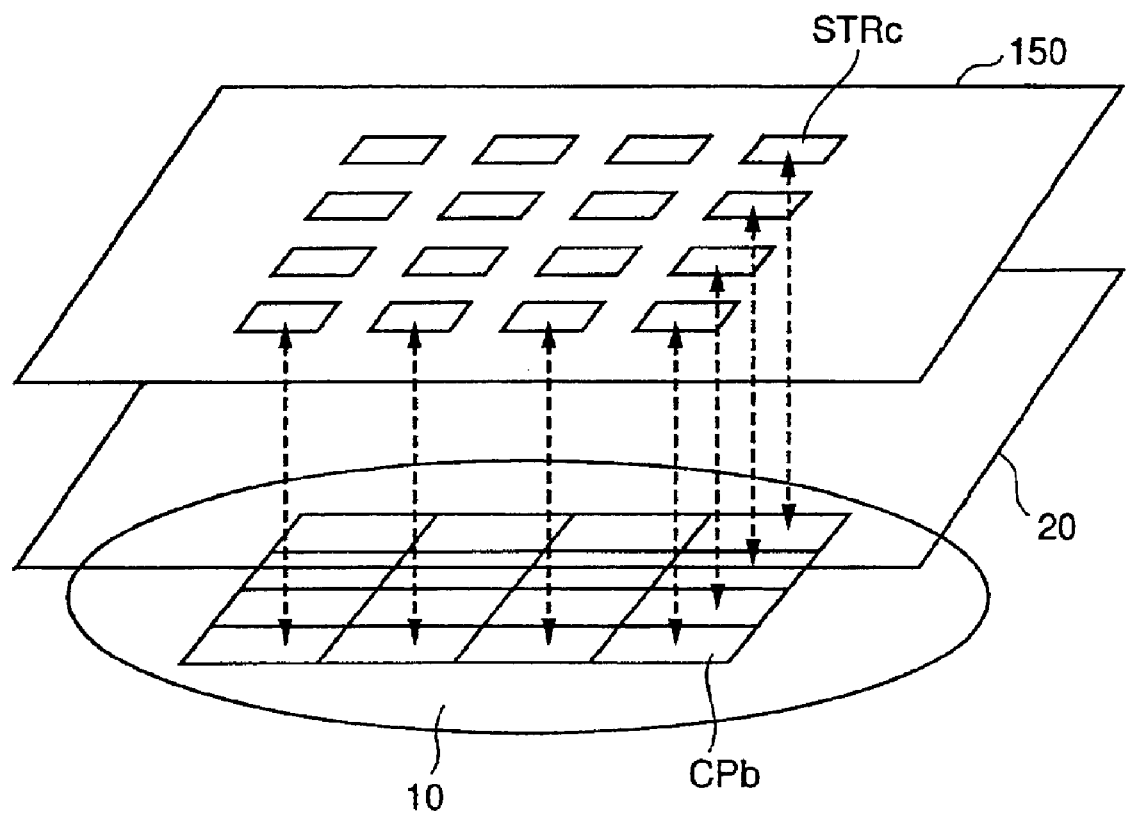
FIG. 15 shows another example of the structure of the semiconductor test device according to the fourth embodiment.

FIG. 15 shows another example of the structure of the semiconductor test device according to the fourth embodiment.

The structure shown in FIG. 15 differs from the structure shown in FIG. 13 in that self-test determining portion STRc is not arranged on the test wafer, but is arranged on test board 150. The structures of self-test determining portion STRc and test target chip CPb as well as contents of the operation test for redundant repair determination are the substantially same as those already described with reference to FIGS. 13 and 14, and therefore description thereof is not repeated. The structures and arrangements of the electrode pad and wafer contactor for providing electrical coupling between test board 150 and test target wafer 10 in the wafer test are the same as those already described in the first embodiment, and therefore description thereof is not repeated.

The structure, in which self-test determining portion STRc is arranged not on the test wafer but on the test board as described above, can achieve similar effects.

Fifth Embodiment

As a fifth embodiment, description will be given on a structure of a self-test circuit which can efficiently store redundant repair data for memory cores of various structures.

Figure 16:
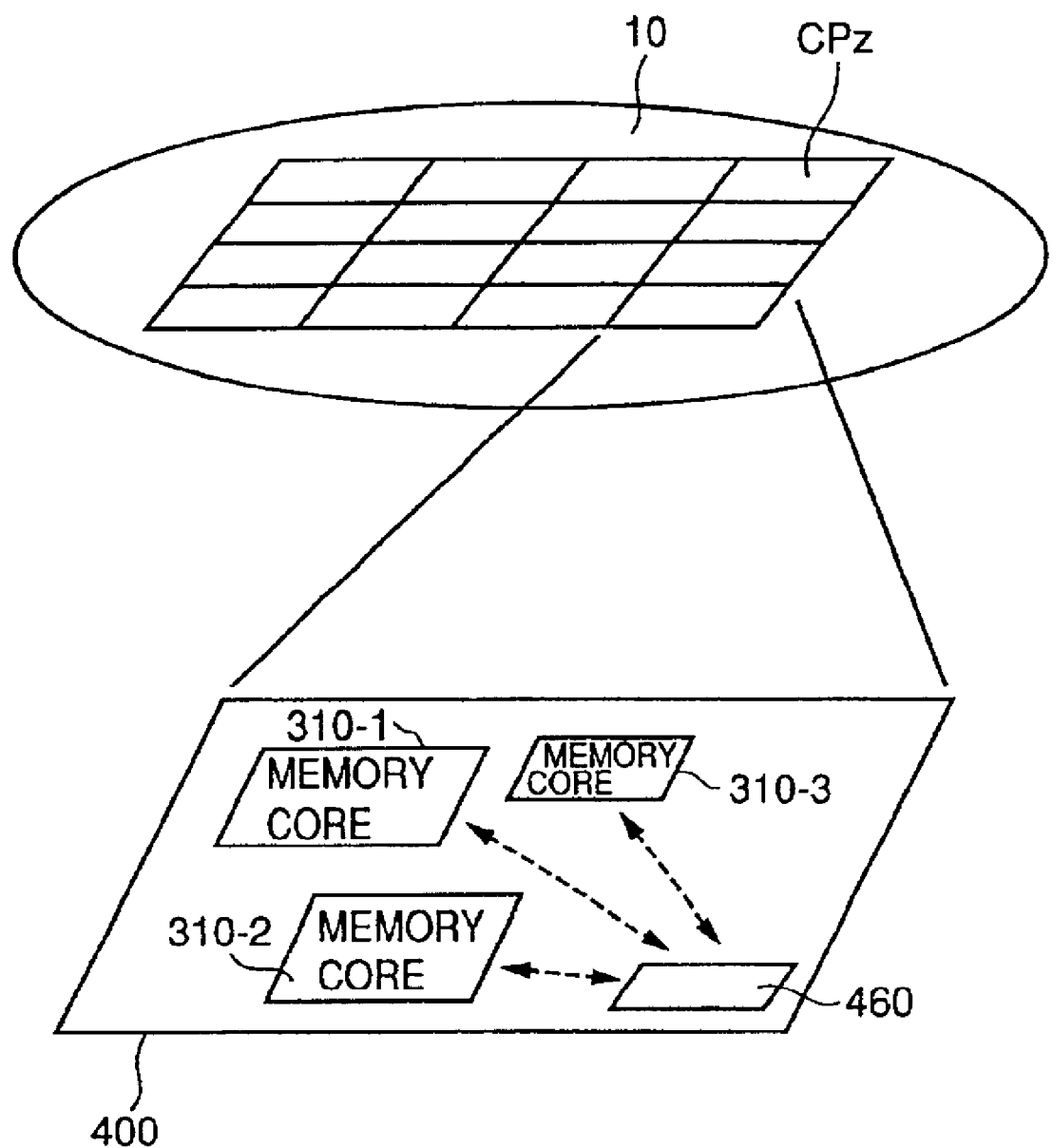
FIG. 16 conceptually shows a structure of a semiconductor device 400 according to a fifth embodiment of the invention.

Referring to FIG. 16, a plurality of chips CPz are arranged on wafer 10, and each chip CPz forms single semiconductor device 400 according to the fifth embodiment of the invention.

Semiconductor device 400 includes a plurality of memory cores 310-1, 310-2 and 310-3 as well as a self-test circuit 460 for conducting the self-test on these memory cores. FIG. 16 shows merely by way of example the three memory cores, but the memory cores may be two or more than three in number.

Figure 17:
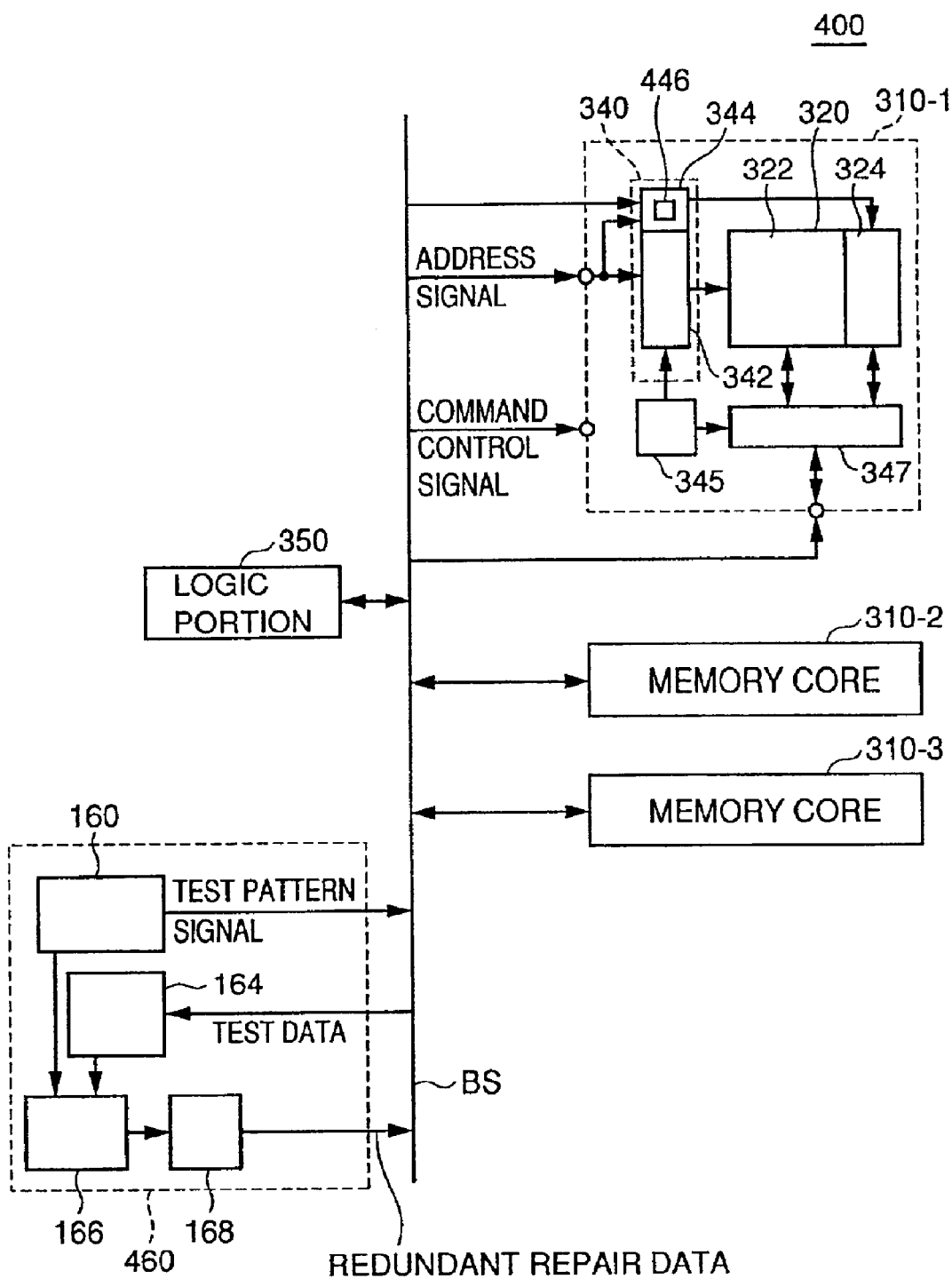
FIG. 17 is a block diagram showing a structure of semiconductor device 400.

Referring to FIG. 17, memory core 310-1 includes memory cell array 320, decoder portion 340, control circuit 345 and a data bus 347. The structure of memory core 310-1 is the same as that of memory core 310 shown in FIG. 11, and therefore specific description thereof is not repeated. Other memory cores 310-2 and 310-3 have the substantially same structures as memory core 310-1.

Semiconductor device 400 further includes logic portion 350 for producing the command control signal and address signal for these memory cores, a self-test circuit 460 for conducting the operation test on these memory cores in the test operation, and data bus BS for transmitting the signals between logic portion 350, self-test circuit 460 and memory cores 310-1, 310-2 and 310-3.

Self-test circuit 460 is arranged within semiconductor device 400, and therefore functions as a so-called BIST circuit. Self-test circuit 460 includes test pattern generating portion 160, PASS/FAIL determining portion 164, redundant repair determining portion 166 and determination result storing portion 168. Determining portion result storing portion 168 stores redundant repair data which is obtained by conducting the operation test on the respective memory cores. Self-test circuit 460 has a function equivalent to that of self-test circuit STR shown in FIG. 9.

In the actual use, the redundant repair data stored in determination result storing portion 168 is referred to by spare decoder 344 in each memory mat. Spare decoder 344 recognizes the defective address in the corresponding memory mat based on the redundant repair information transmitted via data bus BS.

A latch circuit 446 may be employed instead of the program portion which nonvolatilely stores the defective address in spare decoder 344, and the actual operation may be performed in such a manner that recognition of the defective address by spare decoder 344 is executed, e.g., upon every power-on, and latch circuit 446 holds the recognized defective address during the power-on. Thereby, it becomes unnecessary to refer to the redundant repair data in determination result storing portion 166 upon every memory access so that the memory access speed can be increased.

Spare decoder 344 makes a comparison between the defective address and the address signal sent from logic portion 350. When these address and signal match with each other, spare memory array 324 is accessed instead of regular memory array portion 322.

When the address signal sent from logic portion 350 does not match with defective address FAD stored in spare decoder 344, regular decoder 342 executes the memory access to regular memory array 322.

According to the structure described above, the redundant repair data which is obtained in the operation test is stored in the self-test circuit, and the redundant repair data stored in the self-test circuit is referred to for executing the redundant repair determination in the actual operation. Thereby, the redundant repair data can be stored as uniform redundant repair data in the self-test circuit regardless of the specifications such as a bit number and a word structure of each memory mat on the semiconductor device. As a result, test circuits which relate to the redundant repair and have simplified structures can be used for the semiconductor devices such as a device in which a logic and a DRAM (Dynamic Random Access Memory) are arranged in a mixed fashion, and more generally for the semiconductor devices which may have memory mats of various structures, and therefore may be of various types.

Sixth Embodiment

As a sixth embodiment, description will be given on a semiconductor device formed by cutting out a chip, which was formed in a first wafer and has a first function, and arranging it onto a chip, which is formed on a second wafer and has a second function.

Figure 18:
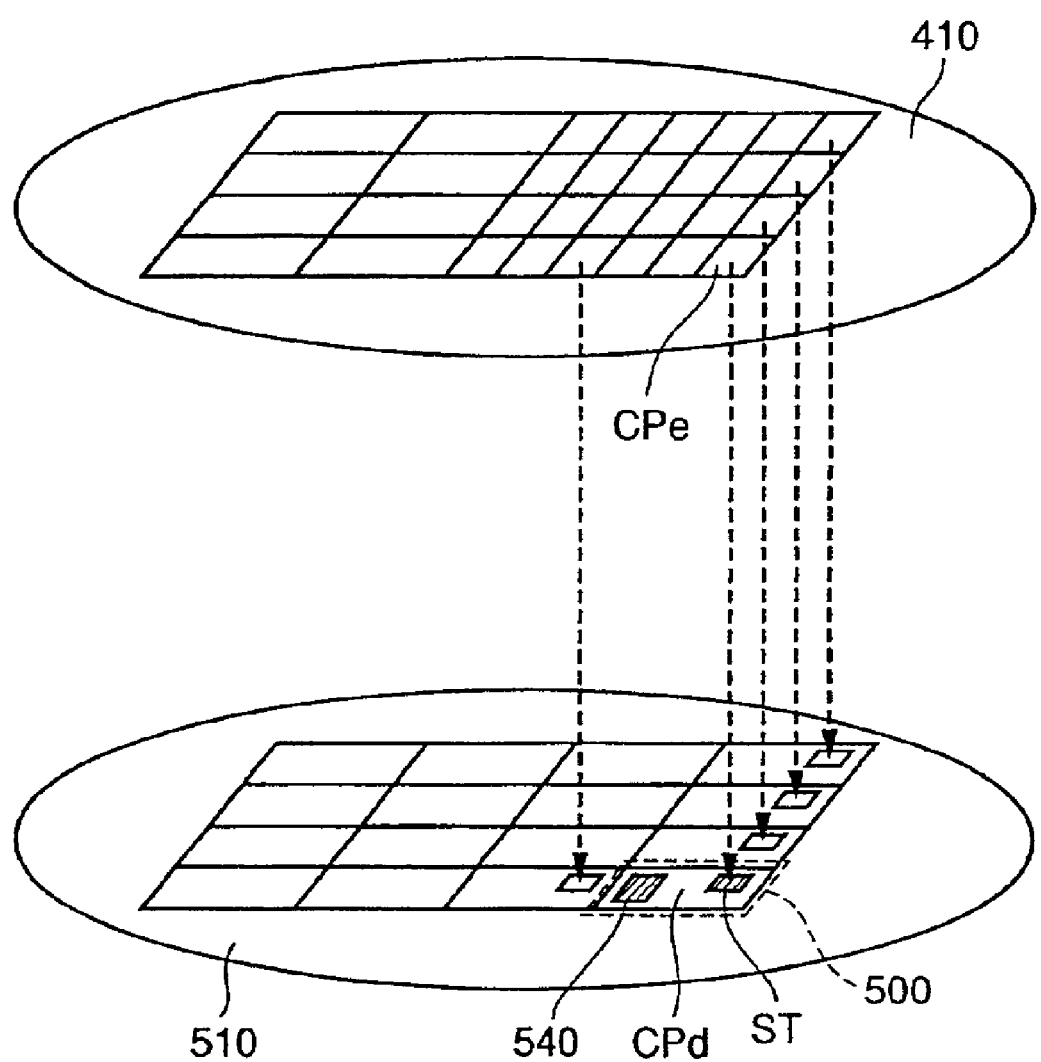
FIG. 18 conceptually shows a structure of a semiconductor device 500 according to a sixth embodiment of the invention.

Referring to FIG. 18, semiconductor device 500 according to the sixth embodiment of the invention includes one of a plurality of chips CPd formed on a wafer 510, and self-test circuit ST formed on a chip CPe which is cut out from another wafer 410. Chip CPe is adhered and electrically connected to chip CPd.

At least one internal circuit 540 is arranged on chip CPd. Self-test circuit ST has a structure similar to that shown in FIG. 2, and conducts the operation test on internal circuit 540.

In the semiconductor device formed of the wafer and chips, the self-test circuit for conducting the operation test on the internal circuit is originally formed in the chip which is formed on another wafer. This chip is then cut out and adhered to chip CPd forming semiconductor device 500 for electrical connection, whereby the semiconductor device can be provided with the BIST function.

In the type not requiring the BIST function, it is not necessary to perform adhesion and electrical connection of the chip provided with the self-test circuit. Since it can be easily determined at the time of assembly whether adhesion of the chip provided with the self-test circuit is to be performed or not, provision and elimination of the self-test circuit can be flexibly selected in accordance with the type so that the chip cost can be reduced.

As described above, the chip which is cut out from the wafer is arranged and adhered onto the chip forming the semiconductor device in another wafer for providing a new function, whereby it is possible to provide the semiconductor device which can flexibly select the addition and elimination of the function.

Seventh Embodiment

Description will now be given on a combination of the technologies described as the sixth embodiment and the third or fourth embodiment.

Figure 19:
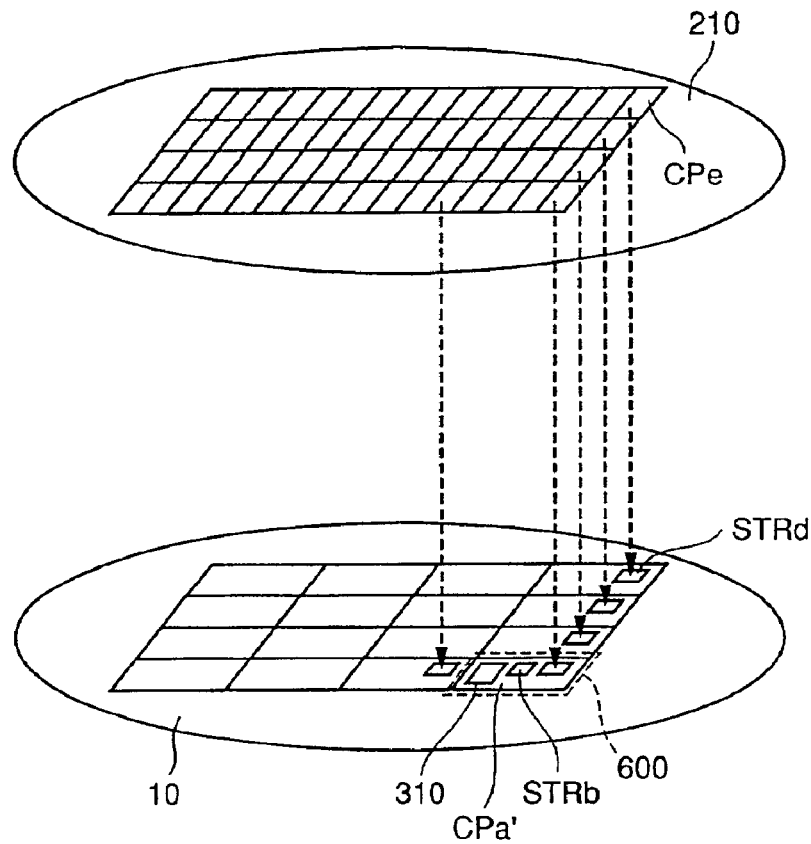
FIG. 19 conceptually shows a structure of a semiconductor device 600 according to a seventh embodiment of the invention.

Referring to FIG. 19, semiconductor device 600 according to a seventh embodiment includes a chip CPa' which is formed on test target wafer 10, and is to be subjected to the operation test with test wafer 210, and a self-test circuit STRd which is formed on chip CPe cut out from test wafer 210.

The structure of chip CPa' to be tested is the substantially same as that of chip CPa already described with reference to FIG. 11, and therefore includes, as an internal circuit, the memory mat having the plurality of memory cells. Chip CPa' differs from chip CPa in that program portion 346 for storing the defective address is not arranged in the memory mat.

Figure 20:
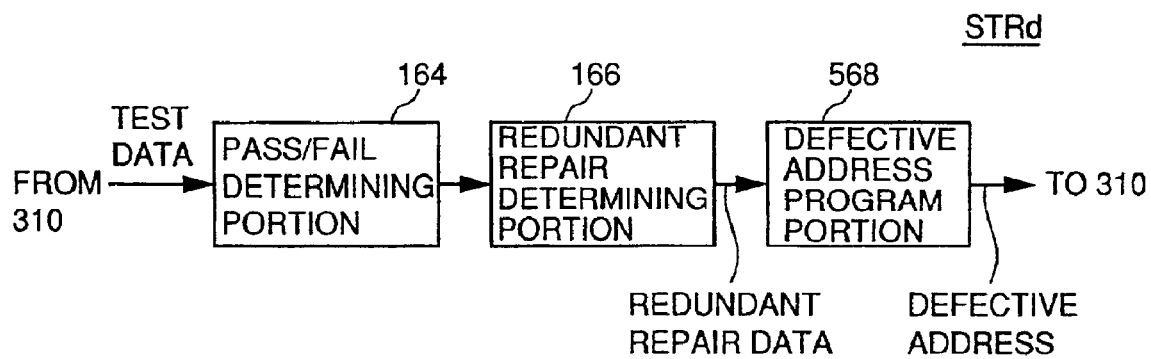
FIG. 20 is a block diagram showing a structure of a self-test circuit STRd.

Referring to FIG. 20, the structure of self-test circuit STRd differs from that of self-test determining portion STRa already described with reference to FIG. 11 in that a defective address program portion 568 is employed instead of determination result storing portion 168. Structures other than the above are the substantially same as those of self-test determining portion STRa, and therefore description thereof is not repeated.

Self-test circuit STRd allows programming of the defective address, e.g., by fuse processing. Since self-test circuit STRd is cut out from test wafer 210, and is arranged integrally on chip CPa' of the test target wafer, the internal circuit can execute the redundant repair in the actual operation in spite of the fact that defective address program portion 568 is arranged on the chip other than the chip provided with the internal circuit.

Since the chip provided with only self-test circuit STRd requires a smaller area than a chip forming the entire structure of semiconductor device 600, the redundant repair data of the plurality of test wafers 10 can be managed by single test wafer 210. Thereby, the redundant repair data can be efficiently read out from the test wafer.

According to the above structure, the program processing corresponding to the plurality of test target wafers can be performed collectively (i.e., at a time) in contrast to the case where programming of the redundant repair data such as a defective address is individually performed for each test target wafer. Therefore, it is possible to simplify the wafer processing of the program system with laser trimmer or electric fuses, and thereby reduction in cost can be performed.

Figure 21:
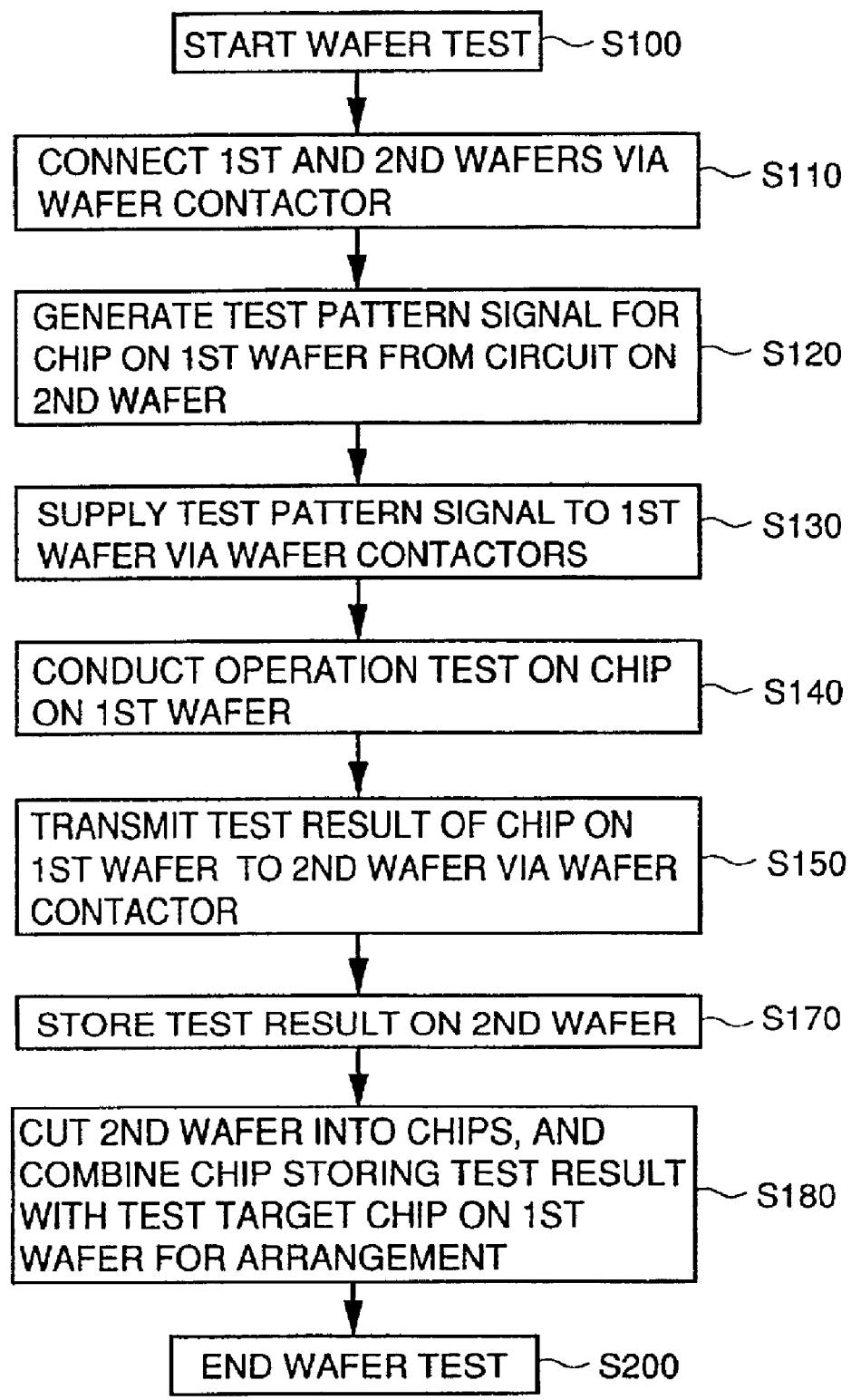
FIG. 21 is a flowchart showing an example of a semiconductor test method according to the seventh embodiment of the invention.

Referring to FIG. 21, the wafer test starts, and the result of the operation test of the first wafer (i.e., the test target wafer) is stored on the second wafer (i.e., the test wafer) through a flow (steps S100-S170), which is the same as that already described in FIG. 7. Therefore, description thereof is not repeated.

Thereafter, the second wafer storing the test results are cut into the chips, and these chips are combined with and arranged on the corresponding test target chips on the first wafer, respectively (step S180). Thereby, the semiconductor device can operate based on the result of the operation test on the wafer level.

Modification of the Seventh Embodiment

Figure 22:
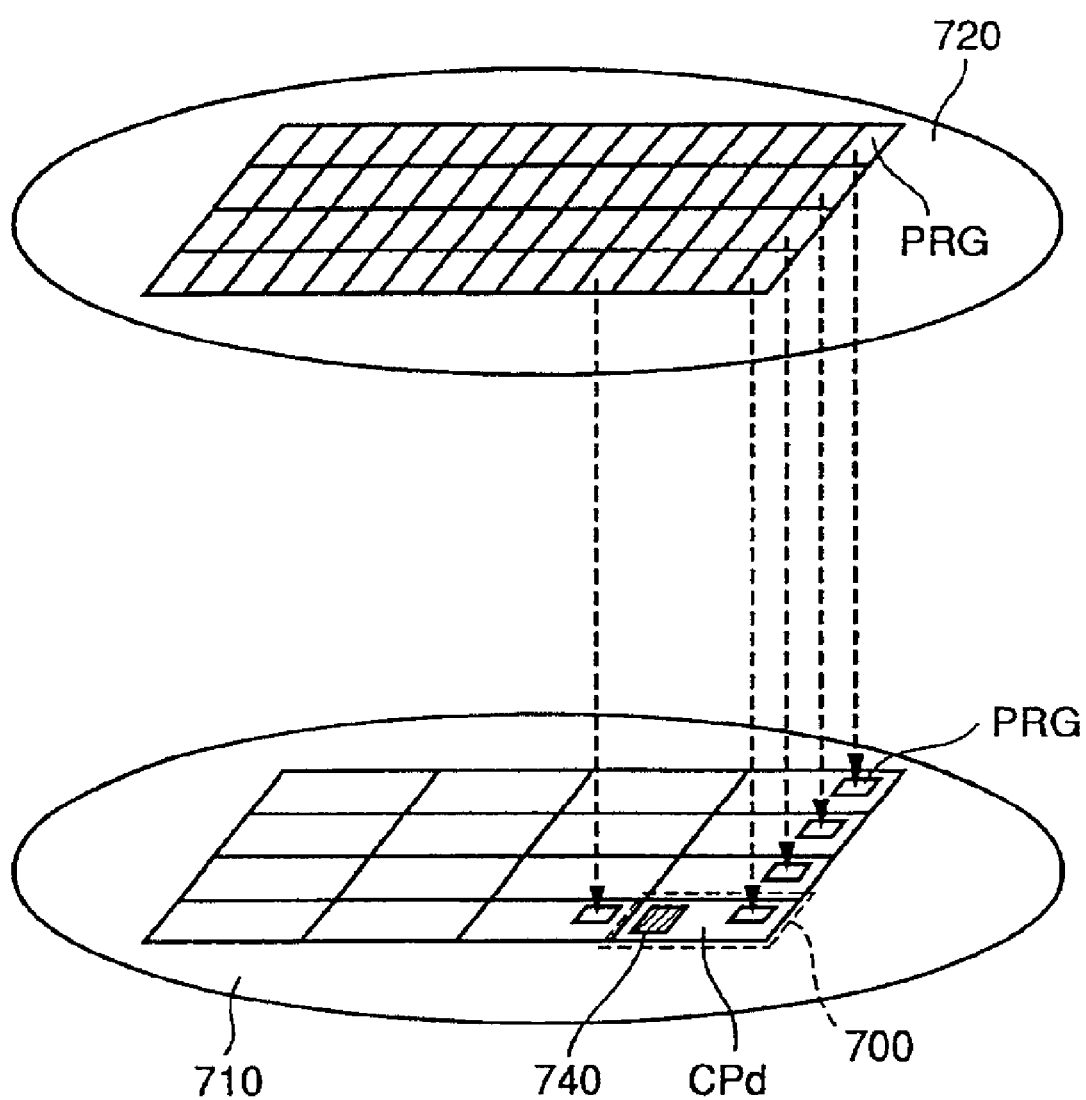
FIG. 22 schematically shows a structure of a semiconductor device 700 according to a modification of the seventh embodiment of the invention.

Referring to FIG. 22, semiconductor device 700 according to a modification of the seventh embodiment includes one of chips CPd formed on wafer 710 and one of program chips PRG which is originally formed on another wafer 720. Chips CPd and PRG are adhered and electrically connected together to form semiconductor device 700.

Program chip PRG may be other than the chip relating the redundant repair data already described with reference to FIG. 19, and may be a chip such as a power supply chip which is provided with an internal high voltage circuit including program for high-voltage trimming, or a power supply chip provided with a power supply system capable of switching external power supply voltage. According to these structures, the trimming information of the internal voltage or the switching information of the external power supply voltage cam be stored by the programming in program chip PRG on wafer 720 side. Therefore, the wafer processing related to the programming can be simplified, and thereby the cost can be reduced, similarly to the case shown in FIG. 19.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor test device for conducting an operation test on a test target wafer having a plurality of first chips, comprising:

a first wafer contactor allowing simultaneous and electrical coupling to each of said plurality of first chips; and a plurality of test circuits provided corresponding to said plurality of first chip, respectively, and each conducting said operation test on a corresponding one of said plurality of first chips, each of said test circuits transmitting and receiving at least a portion of a signal group for performing said operation test through said first wafer contactor to and from said corresponding one of said plurality of first chips; wherein each of said first chips includes:

a plurality of pads for inputting and outputting electrical signals, and a plurality of memory mats operating in accordance with a plurality of independent address signals, respectively;

each of said memory mats has a plurality of memory cells;

each of said test circuits includes:

a test pattern generating portion for generating a test signal supplied to said plurality of memory mats for conducting said operation test, and a plurality of redundant repair determining portions provided corresponding to said plurality of memory mats, respectively;

each of said redundant repair determining portions detects a defective memory cell in said plurality of memory cells based on test data issued from a corresponding one of said plurality of memory mats in response to said test signal;

said semiconductor test device further comprises a test board allowing electrical coupling to said first wafer contactor;

said test board has a plurality of board terminals allowing simultaneous and electrical coupling to said plurality of pads via said first wafer contactor;

each of said redundant repair determining portions is arranged on said test board for connection to at least one of said plurality of board terminals; and said test pattern generating portion is internally arranged in said corresponding one of said plurality of first chips.

2. A semiconductor test device for conducting an operation test on a test target wafer having a plurality of first chips, comprising:

a first wafer contactor allowing simultaneous and electrical coupling to each of said plurality of first chips;

a plurality of test circuits provided corresponding to said plurality of first chips, respectively, and each conducting said operation test on a corresponding one of said plurality of first chips, each of said test circuits transmitting and receiving at least a portion of a signal group for performing said operation test through said first wafer contactor to and from said corresponding one of said plurality of first chips;

a test wafer having a plurality of second chips provided corresponding to said plurality of first chips, respectively;

a second wafer contactor allowing simultaneous and electrical coupling to said plurality of second chips; and a test board for making electrical contact between said first wafer contactor and said second wafer contractor; wherein each of said test circuits transmits at least a portion of a signal group for performing said operation test to and from the corresponding one of said plurality of said first chips through said first and second wafer contactors and said test board;

each of said first chip includes:

a plurality of first pads for inputting and outputting electrical signals, and a memory mat having a plurality of memory cells;

each of said second chips includes a plurality of second pads for inputting and outputting electrical signals;

said first pads can be electrically coupled to said second pads included in the corresponding one of said plurality of second chips via said first and second wafer contactors and said test board;

each of said test circuits includes:

a test pattern generating portion for generating a test signal supplied to said memory mat for conducting said operation test, and a redundant repair determining portion provided corresponding to said memory mat;

said redundant repair determining portion detects a defective memory cell in said plurality of memory cells based on test data issued from said memory mat in response to said test signal;

said redundant repair determining portion is connected to at least one of said plurality of second pads, and is arranged on the corresponding one of said plurality of second chips; and said test pattern generating portion is arranged within the corresponding one of said plurality of first chips.

3. The semiconductor test device according to claim 2, wherein each of said test circuits further includes a defective address storing portion for storing a defective address indicative of said defective memory cell, said memory mat further has a program element for nonvolatilely storing said defective address, and said program element is selectively blown off after said operation test based on said defective address read from said test wafer.

4. The semiconductor test device according to claims 2, wherein
said memory mat further has a program element for nonvolatilely storing said defective address, and
each of said test circuits further includes a program signal generating portion for generating an electrical signal for blowing off said program element based on a defective address indicative of said defective memory cell detected by said redundant repair determining portion.

5. The semiconductor test device according to claim 2, wherein
each of said first chips includes a plurality of memory mats operating in accordance with a plurality of independent address signals, respectively,
each of said test circuits includes said plurality of redundant repair determining portions provided corresponding to said plurality of memory mats, respectively, and
each of said redundant repair determining portions is connected to at least one of said plurality of second pads, and is arranged on the corresponding one of said plurality of second chips.

6. A semiconductor test device for conducting an operation test on a test target wafer having a plurality of first chips, comprising:
a first wafer contactor allowing simultaneous and electrical coupling to each of said plurality of first chips;
a plurality of test circuits provided corresponding to said plurality of first chips, respectively, and each conducting said operation test on a corresponding one of said plurality of first chips,
each of said test circuits transmitting and receiving at least a portion of a signal group for performing said operation test through said first wafer contactor to and from said corresponding one of said plurality of first chips; and
a test wafer having a plurality of second chips provided corresponding to said plurality of first chips, respectively;
a second wafer contactor allowing simultaneous and electrical coupling to said plurality of second chips; and
a test board for making electrical contact between said first wafer contactor and said second wafer contactor; wherein
each of said test circuits transmits at least a portion of a signal group for performing said operation test to and from the corresponding one of said plurality of said first chips through said first and second wafer contactors and said test board;
each of said first chips has a first function,
each of said second chips has a second function different from said first function,
one of said plurality of first chips and one of said plurality of second chips form a multi-chip module, and
each of said test circuits is mounted within at least one of said first chip and said second chip.

7. A semiconductor test method of conducting an operation test on a wafer level, comprising the steps of:
electrically coupling first and second wafers together through a wafer contactor;
producing a plurality of test signals for conducting said operation test on a plurality of first chips formed on said first wafer by a plurality of second chips formed on said second wafer corresponding to said plurality of first chips, respectively;
transmitting said plurality of test signals from said second wafer to said first wafer via said wafer contactor;
transmitting and receiving a plurality of test data issued from said plurality of first chips to said second wafer from said first wafer through said wafer contactor in response to said plurality of test signals; and
cutting said second wafer into said plurality of second chips, and combining each of said second chips thus cut with a corresponding one of said first chips for arrangement on said corresponding first chip.

8. A semiconductor device comprising:
a plurality of memory mats operating in accordance with a plurality of independent address signals, respectively,
each of said memory mats including
a regular memory array having a plurality of memory cells arranged in rows and columns;
a spare memory array for repairing a defective memory cell in said regular memory array, and
a spare decoder for selecting said spare memory array when the received address signal matches with a defective address indicative of said defective memory cell in a corresponding one of said memory mats and
an internal test circuit for conducting an operation test on said plurality of memory mats,
said internal test circuit including:
a test pattern generating portion for generating a test signal to be supplied to said plurality of memory mats for conducting said operation test,
a redundant repair determining portion for detecting said defective memory cell in each of said memory mats based on test data issued from each of said memory mats in response to said test signal, and
a defective address storing portion for storing said defective address.

9. A semiconductor memory device comprising:
one of a plurality of first chips formed on a first wafer and each having a first function; and
one of a plurality of second chips formed on a second wafer and each having a second function different from said first function,
said second chips being cut out from said second wafer and being electrically connected to said first chips for arrangement; wherein
each of said first chip includes an internal circuit for performing said first function, and
each of said second chips has a test circuit for performing an operation test on said internal circuit.

10. A semiconductor memory device comprising:
one of a plurality of first chips formed on a first wafer and each having a first function; and
one of a plurality of second chips formed on a second wafer and each having a second function different from said first function,
said second chips being cut out from said second wafer and being electrically connected to said first chips for arrangement; wherein
each of said second chip has a smaller area than each of said first chip;
each of said first chip includes an internal circuit having a plurality of memory cells arranged in row and columns;
said semiconductor device further comprises a test circuit for conducting an operation test on said internal circuit;

said test circuit includes:

a test pattern generating portion for generating a test signal to be supplied to said internal circuit for performing said operation test, and a redundant repair determining portion for detecting a defective memory cell in said plurality of memory cells based on test data issued from said internal circuit in response to said test signal;

said redundant repair determining portion has a program circuit for nonvolatilely storing a defective address indicative of said defective memory cell;

said internal circuit further includes:

a spare memory array for repairing said defective memory cell, and a spare decoder for selecting said spare memory array when the received address signal matches with said defective address stored in said program circuit; and said program circuit is arranged on said second chip.

11. A semiconductor device comprising:

one of a plurality of first chips formed on a first wafer and each having a first function; and one of a plurality of second chips formed on a second wafer and each having a second function different from said first function, said second chips being cut out from said second wafer and being electrically connected to said first chips for arrangement; wherein each of said first chip includes an internal circuit for performing said first function, and each of said second chips has a test circuit for performing an operation test on said internal circuit.

12. A semiconductor device comprising:

one of a plurality of first chips formed on a first wafer and each having a first function; and one of a plurality of second chips formed on a second wafer and each having a second function different from said first function, said second chips being cut out from said second wafer and being electrically connected to said first chips for arrangement; wherein each of said second chip has a smaller area than each of said first chip;

each of said first chip includes an internal circuit having a plurality of memory cells arranged in row and columns;

said semiconductor device further comprises a test circuit for conducting an operation test on said internal circuit;

said test circuit includes:

a test pattern generating portion for generating a test signal to be supplied to said internal circuit for performing said operation test, and a redundant repair determining portion for detecting a defective memory cell in said plurality of memory cells based on test data issued from said internal circuit in response to said test signal;

said redundant repair determining portion has a program circuit for nonvolatilely storing a defective address indicative of said defective memory cell;

said internal circuit further includes:

a spare memory array for repairing said defective memory cell, and a spare decoder for selecting said spare memory array when the received address signal matches with said defective address stored in said program circuit; and said program circuit is arranged on said second chip.

* * * * *